United States Patent
Tokita et al.

(10) Patent No.: US 8,021,033 B2
(45) Date of Patent: Sep. 20, 2011

(54) LIGHT GUIDE MEMBER, PLANAR LIGHT SOURCE DEVICE PROVIDED WITH THE LIGHT GUIDE MEMBER, AND DISPLAY APPARATUS USING THE PLANAR LIGHT SOURCE DEVICE

(75) Inventors: Koji Tokita, Chiba (JP); Takeo Watanabe, Chiba (JP); Shuichi Naijo, Chiba (JP); Shuji Gomi, Chiba (JP)

(73) Assignee: Showa Denko K.K., Tokyo (JP)

( * ) Notice: Subject to any disclaimer, the term of this patent is extended or adjusted under 35 U.S.C. 154(b) by 407 days.

(21) Appl. No.: 12/095,433

(22) PCT Filed: Nov. 27, 2006

(86) PCT No.: PCT/JP2006/324130
§ 371 (c)(1),
(2), (4) Date: May 29, 2008

(87) PCT Pub. No.: WO2007/064002
PCT Pub. Date: Jun. 7, 2007

(65) Prior Publication Data
US 2009/0129058 A1    May 21, 2009

Related U.S. Application Data

(60) Provisional application No. 60/748,191, filed on Dec. 8, 2005, provisional application No. 60/789,128, filed on Apr. 5, 2006.

(30) Foreign Application Priority Data

Nov. 30, 2005  (JP) .................................. 2005-345782
Mar. 23, 2006  (JP) .................................. 2006-080377

(51) Int. Cl.
*F21V 7/04* (2006.01)
*G02F 1/1335* (2006.01)

(52) U.S. Cl. ........ 362/615; 362/621; 362/623; 362/97.3

(58) Field of Classification Search .................. 362/561, 362/97.1–4, 330, 631–634, 612, 27, 26, 29, 362/30, 615, 621, 623, 616, 97.1, 97.3
See application file for complete search history.

(56) References Cited

U.S. PATENT DOCUMENTS

| 3,610,911 | A  | * | 10/1971 | Curl ............................... 362/621 |
| 5,249,104 | A  | * | 9/1993  | Mizobe ......................... 362/605 |
| 6,923,548 | B2 | * | 8/2005  | Lim ............................... 362/612 |
| 7,780,306 | B2 | * | 8/2010  | Hoshi ........................... 362/97.1 |
| 2002/0024803 | A1 |   | 2/2002 | Adachi et al. |

FOREIGN PATENT DOCUMENTS

| JP | 5-27238 A   | 2/1993 |
| JP | 10-82915 A  | 3/1998 |
| JP | 10-247411 A | 9/1998 |
| JP | 2001-42782 A | 2/2001 |
| JP | 2002-75036 A | 3/2002 |
| JP | 2004-45645 A | 2/2004 |

* cited by examiner

*Primary Examiner* — Bao Q Truong
(74) *Attorney, Agent, or Firm* — Sughrue Mion, PLLC

(57) ABSTRACT

A light guide member laminated on the upper face of a luminous device mounting substrate on which a luminous device is mounted and which is for diffusing and guiding upward light emitted from the luminous device. The light guide member includes a light reflecting portion formed on the bottom face of the light guide member in an area other than an area near the luminous device, and a section in which a light reflecting portion is not formed on the bottom face of the light guide member at a position near the luminous device. Also disclosed is a planar light source device provided with the light guide member, and a display apparatus using the planar light source device.

19 Claims, 26 Drawing Sheets

Fig. 6
(A) 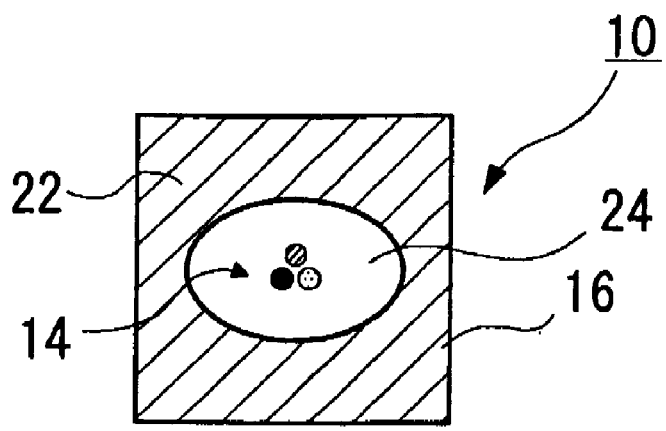
(B) 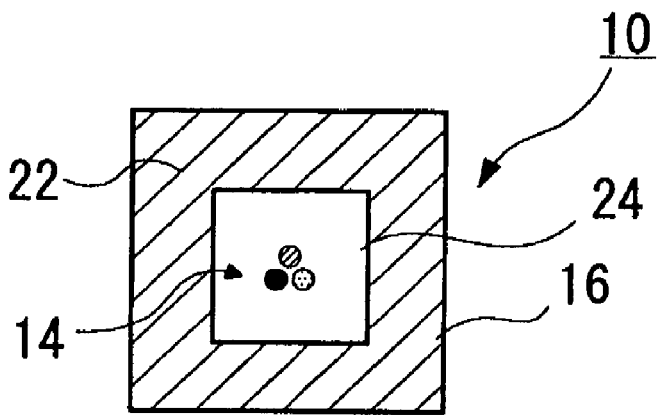
(C) 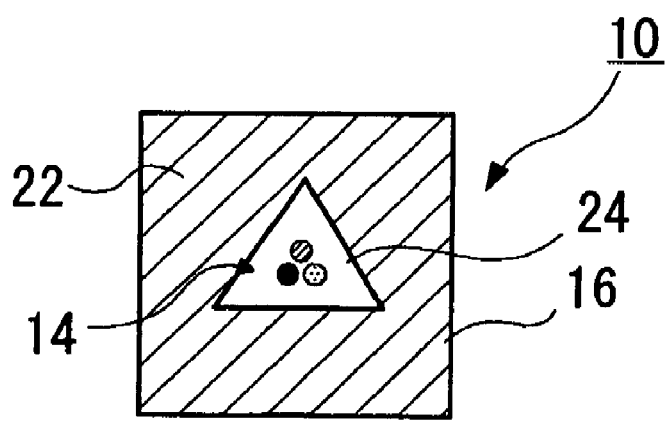
(D) 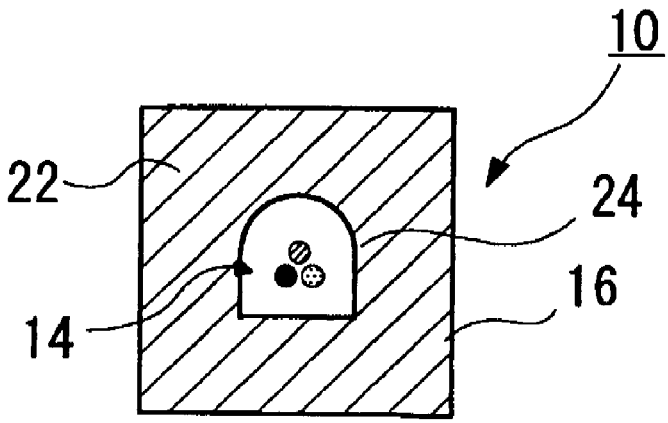

Fig. 10
(A)
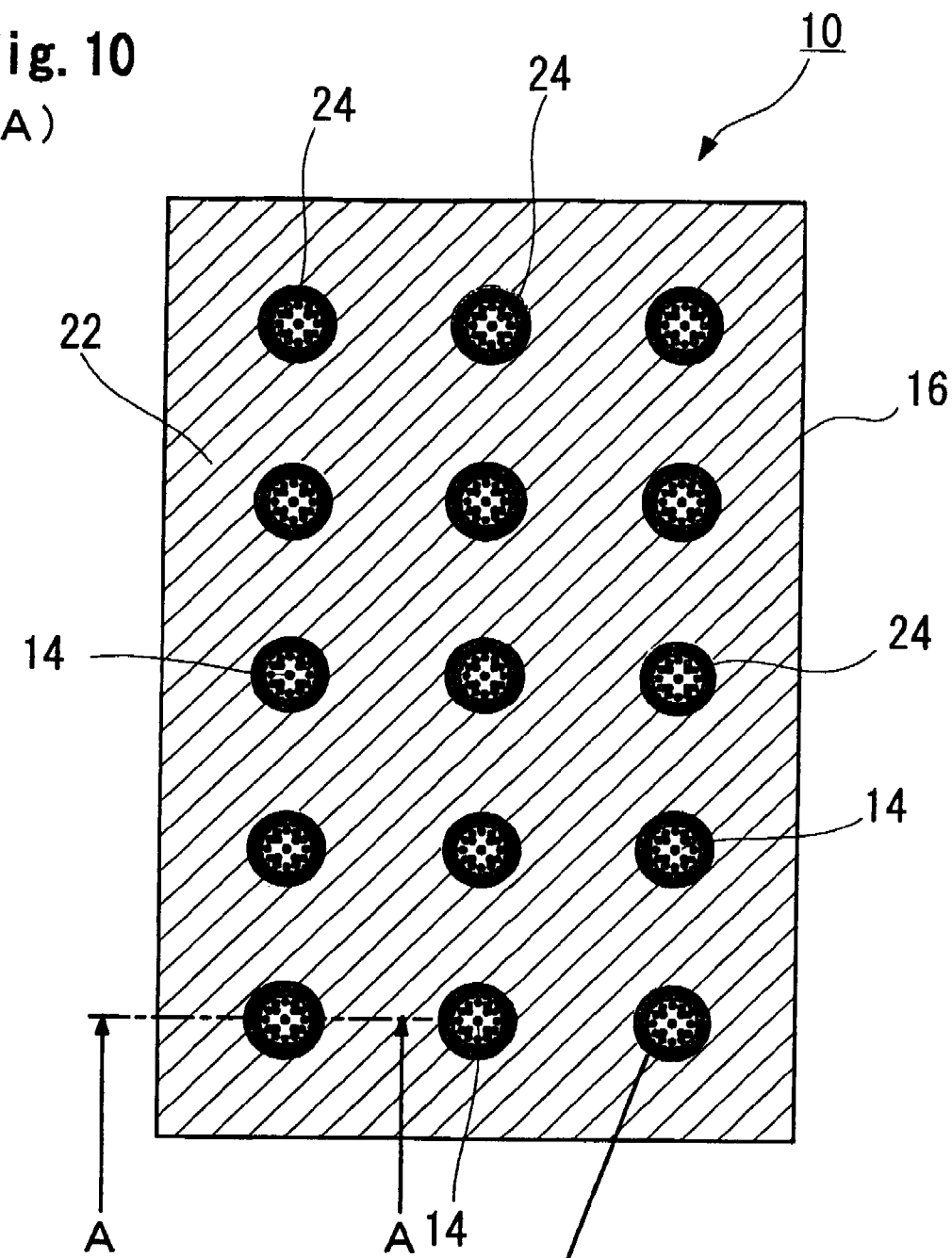
(B)
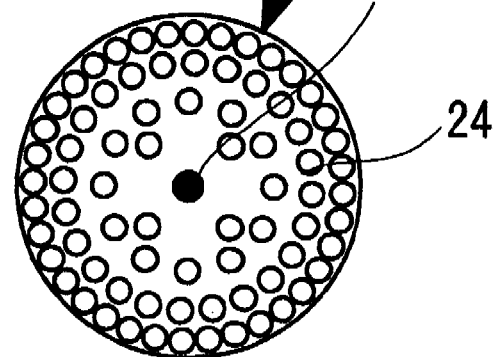

Fig. 14
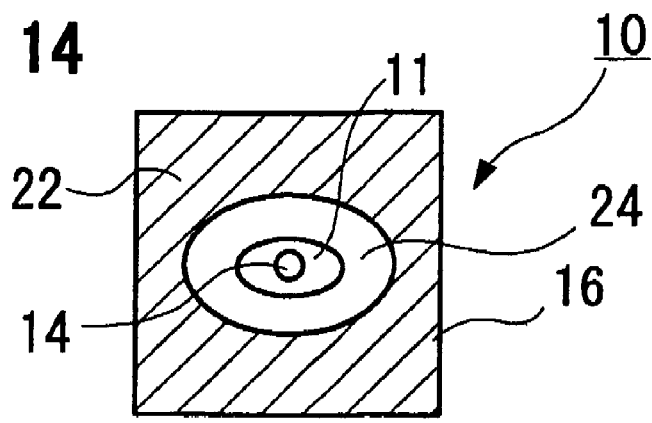
(A)
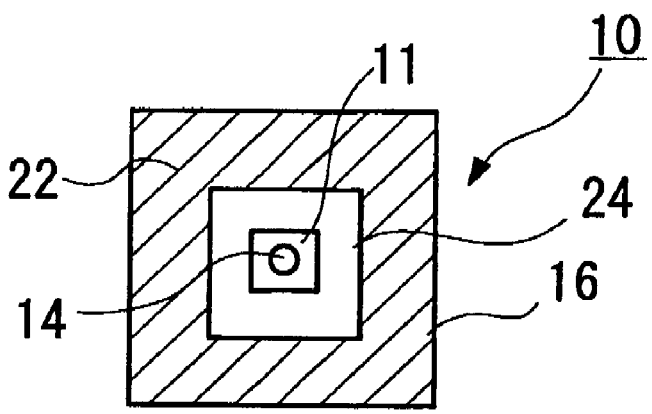
(B)
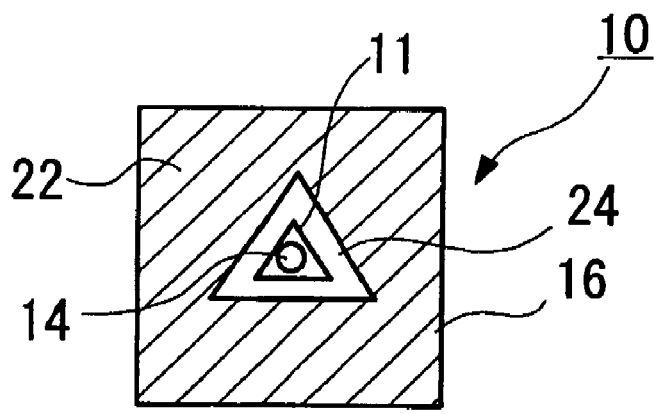
(C)
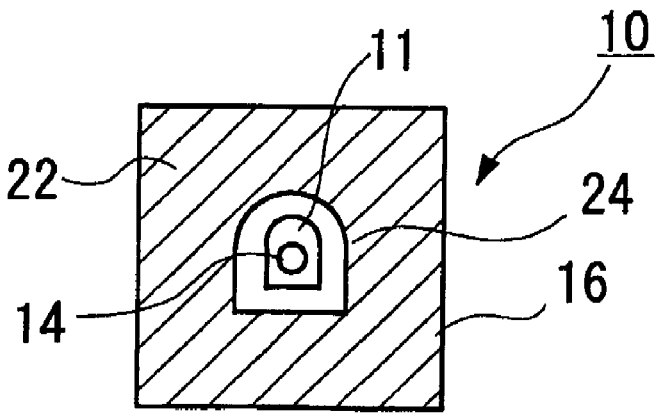
(D)

LIGHT GUIDE MEMBER, PLANAR LIGHT SOURCE DEVICE PROVIDED WITH THE LIGHT GUIDE MEMBER, AND DISPLAY APPARATUS USING THE PLANAR LIGHT SOURCE DEVICE

CROSS REFERENCES TO RELATED APPLICATIONS

This application is an application filed under 35 U.S.C. §111(a) claiming benefit pursuant to 35 U.S.C. §119(e)(1) of the filing date of Provisional Application 60/748,191 filed on Dec. 8, 2005 and 60/789,128 filed on Apr. 5, 2006 pursuant to 35 U.S.C. §111(b).

TECHNICAL FIELD

The present invention relates to a light guide member, a planar light source device, and a display apparatus using the planar light source device. In detail, the present invention relates to a light guide member, a planar light source device provided with the light guide member, that are used as an illuminant such as an advertising lamp, an illumination, and a back light for a liquid crystal display, and that are capable of uniformly diffusing and guiding upward a light from a luminous device, and a display apparatus using the planar light source device such as a liquid crystal display apparatus.

BACKGROUND ART

In recent years, there is widely used a display apparatus using a planar light source device (back light) for irradiating a light from a back face or a side face of a panel, such as a liquid crystal display. Conventionally, the main stream of such a back light illuminant for a liquid crystal display has been the so-called edge light type in which a cold cathode tube as an illuminant is disposed on the edge face of the chassis for thinning and low power consumption of the apparatus.

As such a back light illuminant of the edge light type, an illuminant with a configuration shown in FIG. 24 is used.

More specifically, for a back light illuminant 100 of the edge light type, a cold cathode tube 104 is disposed on the edge portion of a chassis 102. A light guide member 106 is disposed on the side of the cold cathode tube 104, and a diffusing sheet 108 is disposed over the upper face of the light guide member 106, thereby configuring the back light illuminant 100.

A reflecting portion 116, which is made by a minute uneven structure or made by drawing a dot shape with a white ink for instance, is formed under the light guide member 106. Moreover, a liquid crystal panel 110 is laminated on the upper face of the diffusing member 108 of the back light illuminant 100, thereby configuring a liquid crystal display apparatus 112.

For the back light illuminant 100 of the edge light type, a light that has been irradiated from the cold cathode tube 104 by making the cold cathode tube 104 to be illuminant enters a side portion of the light guide member 106.

A light that has entered the light guide member 106 is diffused while repeating a reflection between the reflecting portion 116 that has been formed under the light guide member 106 and that is made by a minute uneven structure or made by drawing a dot shape with a white ink for instance, and an upper face 118 of the light guide member 106. The light is then uniformly guided upward from the upper face 118 of the light guide member 106.

By the above configuration, a light is uniformly diffused by the diffusing member 108, thereby reducing a nonuniformity in luminance of the liquid crystal panel 110.

However, a demand of enlarging a liquid crystal display has been increased in recent years, and such a back light illuminant 100 of the edge light type has a limitation in improving a luminance and a uniformity in the luminance.

Therefore, an adoption of a direct lighting type light is examined for a large size liquid crystal display.

However, in the case in which the above described cold cathode tube is used as a direct lighting type light, since the cold cathode tube is comparatively large, a thickness of a liquid crystal display is enlarged. In addition, there are problems that color reproducibility and a response of the cold cathode tube is not satisfactory, and that an after-image phenomenon occurs.

In recent years, a luminous efficiency of a luminous device has been extremely improved, and an application of the luminous device to an illumination is being progressed. In particular, in the case in which there is used a light emitting diode (hereafter referred to as an LED) as a back light illuminant (planar light source) for a liquid crystal display, an excellent color reproducibility and a high speed response can be implemented and it is expected that a high quality image is achieved.

Therefore, conventionally, there has been proposed a back light illuminant of a direct lighting type in which a plurality of LEDs is disposed at a constant pitch below a liquid crystal panel.

As such a back light illuminant of a direct lighting type, an illuminant with a configuration shown in FIG. 25 is proposed.

More specifically, for a back light illuminant 200 of the direct lighting type, a plurality of LED lamps 206 is disposed at a constant pitch in an array pattern on the bottom face 204 of a chassis 202.

A diffusing member 208 is disposed over the upper face of the chassis 202 apart at a constant distance from the LED lamps 206, and a prism sheet 210 is disposed over the upper face of the diffusing member 208, thereby configuring the back light illuminant 200.

A reflecting portion 214 made of a reflecting sheet or the like is formed on the bottom face 204 and a side face 212 of a chassis 202.

For the back light illuminant 200 of a direct lighting type that is configured as described above, in the case in which a light is generated from the LED lamps 206, the emitted light travels directly toward the diffusing sheet 208. In addition, the emitted light is also reflected by the reflecting portion 214 on the bottom face 204 and a side face 212 of a chassis 202, and travels toward the diffusing sheet 208.

The light that has entered the diffusing sheet 208 is then diffused in the diffusing sheet 208, and is inclined in a vertical direction by passing through the prism sheet 210 on the upper face of the diffusing sheet 208. The light then enters a liquid crystal panel (not shown) disposed over the upper face of the prism sheet 210.

Moreover, lights emitted from the LED lamps 206 are mixed in a space between the LED lamps and the diffusing sheet 208. The mixing is then improved by a diffusion in the diffusing sheet 208, thereby implementing a uniform luminance and a uniform chromaticity.

Moreover, in general, a luminance at the section directly over the LED lamps 206 is higher than that of other sections. Therefore, a uniformity in a luminance can be further improved by increasing a diffusability of the diffusing sheet 208 at the section directly over the LED lamps 206.

For the conventional the back light illuminant 200 of a direct lighting type, the diffusing sheet 208 is disposed and the diffusing sheet 208 is apart from the LED lamps 206 in order to uniform a luminance and a chromaticity as described above. However, even in such a case, the above means is insufficient to solve a problem that a luminance at the section directly over the LED lamps 206 becomes higher.

Recently, a color mixture is carried out by using LED lamps of a plurality of colors (RGB) composed of LEDs of three primary colors of red, green, and blue in particular (without using a monochromatic LED). In such a case, a color mixture is insufficient and an unevenness of colors may be found in some cases.

Accordingly, to decrease a nonuniformity in luminance and an unevenness of colors, a diffusability of the diffusing sheet 208 at the section directly over the LED lamps 206 is further increased as described above.

In addition, in Patent Document 1 (Japanese Laid-Open Patent Publication No. 2001-42782), a so-called lighting curtain such as a gray printing layer with a light semi-permeability is disposed directly over the LED lamps in order to reduce a luminance at the section directly over the LED lamps in some cases.

However, the above means cause a utilization efficiency of a light to be lowered.

Moreover, in the case in which the diffusing sheet 208 is made further apart from the LED lamps 206, a nonuniformity in luminance and an unevenness of colors can be decreased. However, this method causes a thickness of a back light to be enlarged, and is not preferable for a flat panel display.

Consequently, Patent Document 2 (Japanese Patent Publication No. 1998-82915) proposes a planar light source device 300 as shown in FIG. 26.

More specifically, for the planar light source device 300, a light guide member 306 is laminated on the upper face of a luminous device mounting substrate 308 on which an LED lamp 302 has been mounted. A concave for LED lamp housing 304 is formed in the light guide member 306 at the position corresponding to the LED lamp 302 in such a manner that a width of the concave is narrower at a deeper section from the surface of the light guide member.

Moreover, a reflecting portion 312 made of a reflecting sheet or the like is formed on the bottom face 310 of the light guide member 306 except for the section corresponding to the concave for LED lamp housing 304.

By the above configuration, as shown in FIG. 26, a light B1 that has been emitted from the LED lamp 302 is diffused while repeating a reflection between an upper face 314 of the light guide member 306 and the reflecting portion 312 formed on the bottom face 310 of the light guide member 306 as shown by an arrow B2, and is uniformly guided upward from the upper face 314 of the light guide member 306.

As a result, a light is uniformly diffused by a diffusing sheet (not shown) formed on the upper face of the light guide member 306, thereby preventing a nonuniformity in luminance from occurring and implementing a uniform luminance distribution at a light emitting plane of the light guide member 306.

Consequently, the planar light source device 300 disclosed in Patent Document 2 is thinner than conventional apparatuses, has little unevenness of colors, and is capable of improving a luminance.

[Patent document 1] Japanese Laid-Open Patent Publication No. 2001-42782

[Patent document 2] Japanese Patent Publication No. 1998-82915

DISCLOSURE OF THE INVENTION

Problems to be Solved by the Invention

A luminance is tried to be uniformed in the planar light source device 300 described in Patent Document 2. However, as shown in FIG. 26, for the planar light source device 300, a light irradiated from the LED lamp 302 is reflected by the reflecting portion 312 even near around the LED lamp 302 as shown by an arrow B3, and is emitted and guided upward from the upper face 314 of the light guide member 306.

As a result, an amount of lights emitted from the upper face 314 of the light guide member 306 at the section directly over the LED lamps 206 is large, and as shown by the alternate long and short dash line in the graph of FIG. 4, the above means is insufficient to solve a problem that a luminance at the section directly over the LED lamps 206 becomes higher.

The present invention was made in consideration of such conditions, and an object of the present invention is to provide a light guide member that is laminated on the upper face of a luminous device mounting substrate on which a luminous device such as an LED lamp has been mounted. In the light guide member, a luminance at the section directly over the luminous device is lowered, a luminance distribution on a light emission face of the light guide member can be uniformed, a nonuniformity in luminance and an unevenness of colors can be decreased, a utilization efficiency of a light can be increased, and a high luminance can be implemented. In addition, a planar light source device using the light guide member can also be thinned and miniaturized.

Moreover, another object of the present invention is to provide a planar light source device, and a display apparatus using the planar light source device in which a nonuniformity in luminance and an unevenness of colors can be decreased, a utilization efficiency of a light can be increased, and a high luminance can be implemented. In addition, the planar light source device and the display apparatus can also be thinned and miniaturized.

Means for Solving the Problems

The present inventors have researched the above problems to solve them. As a result, the present inventors have created the light guide member related to the present invention, a planar light source device provided with the light guide member, and a display apparatus using the planar light source device.

More specifically, the present invention involves the following modes (1) to (16) for instance.

(1) A light guide member, which is disposed over the upper face of a luminous device mounting substrate on which a luminous device is mounted and which is for diffusing and guiding upward a light emitted from the luminous device, is characterized by comprising:

a light reflecting portion formed on the bottom face of the light guide member at a position not near around the luminous device, and a section in which a light reflecting area is not formed on the bottom face of the light guide member at a position near around the luminous device.

(2) A light guide member as defined in above (1) is characterized by further comprising:

a concave for the luminous device in the light guide member at the position corresponding to the luminous device, and a light semi-permeable portion on a part of a surface on the concave of the concave for the luminous device.

(3) A light guide member as defined in above (2) is characterized in that the light semi-permeable portion on the surface on the concave is formed at the position over the luminous device.

(4) A light guide member as defined in any one of above (1) to (3) is characterized in that the area near around the luminous device is an area to a uniform distance from the luminous device.

(5) A light guide member as defined in any one of above (1) to (4) is characterized by further comprising a light reflecting area in a dot shape in the area near around the luminous device in such a manner that a dot density of the light reflecting portion is lower at a section closer to the luminous device.

(6) A light guide member as defined in above (1) is characterized by further comprising a light semi-permeable portion at a position on the upper face of the light guide member corresponding to the luminous device.

(7) A light guide member as defined in above (6) is characterized in that the light semi-permeable portion is formed on the upper face of the light guide member at the position directly over the luminous device.

(8) A light guide member as defined in above (7) is characterized in that the light semi-permeable portion is formed on the upper face of the light guide member near around the luminous device to a uniform distance from the luminous device.

(9) A light guide member as defined in any one of above (1) to (8) is characterized in that a plurality of the luminous devices mounted on the luminous device mounting substrate is disposed apart and the areas near around the luminous devices in which a light reflecting portion is not formed are disposed at a plurality of the positions of the bottom face of the light guide member corresponding to the luminous devices.

(10) A light guide member as defined in above (9) is characterized in that D/4 is equivalent to or larger than d in the case in which a distance between adjacent luminous devices of a plurality of the luminous devices is D and a uniform distance from the luminous device to a peripheral edge of the area near around the luminous device in which a light reflecting portion is not formed is d.

(11) A light guide member as defined in any one of above (1) to (10) is characterized in that the luminous device mounted on the luminous device mounting substrate is configured by a unit luminous device in which luminous devices of plural kinds with different luminance colors are combined, and the area near around the luminous device in which a light reflecting portion is not formed is formed corresponding to the unit luminous device.

(12) A light guide member as defined in any one of above (2) to (5) is characterized in that the luminous device mounted on the luminous device mounting substrate is configured by a unit luminous device in which luminous devices of plural kinds with different luminance colors are combined, and the concave for the luminous device is formed corresponding to the unit luminous device.

(13) A planar light source device is characterized in that the light guide member as defined in any one of above (1) to (12) is disposed over the upper face of the luminous device mounting substrate on which the luminous device is mounted.

(14) A planar light source device as defined in above (13) is characterized in that the luminous device is a light emitting diode.

(15) A display apparatus is characterized by comprising a display portion disposed over the upper face of the planar light source device as defined in above (13) or (14).

(16) A display apparatus as defined in above (15) is characterized in that the display portion is a liquid crystal panel.

Effect of the Invention

A light guide member related to the present invention comprises a light reflecting portion formed on the bottom face of the light guide member at a position not near around the luminous device, and a section in which a light reflecting portion is not formed on the bottom face of the light guide member at a position near around the luminous device, in such a manner that the strength of a diffusion upward at the bottom face of the light guide member near around the luminous device is smaller than the strength of a diffusion upward at the bottom face of the light guide member provided with a light reflecting portion at the periphery section thereof. Consequently, a luminance at the section directly over the luminous device is lowered, a luminance distribution on the light emission face of the light guide member can be uniformed, a nonuniformity in luminance and an unevenness of colors can be decreased, a utilization efficiency of a light can be increased, and a high luminance can be implemented.

By an embodiment of the present invention, there is formed a light semi-permeable portion at a position on the upper face of the light guide member corresponding to the luminous device, or there is formed a light semi-permeable portion having a function for reflecting and diffusing a light on the surface on the concave of the concave for the luminous device formed in the light guide member. Consequently, since a light emitted from the luminous device is diffusely reflected by the light semi-permeable portion, an increase in a luminance at the section directly over the luminous device is suppressed, a luminance distribution on a light emission face of the light guide member can be uniformed, a nonuniformity in luminance and an unevenness of colors can be decreased, a utilization efficiency of a light can be increased, and a high luminance can be implemented.

Moreover, in the case in which the light guide member is used as a planar light source device, a luminance distribution can be uniformed, a nonuniformity in luminance and an unevenness of colors can be decreased, a utilization efficiency of a light can be increased, a high luminance can be implemented, and the device can be thinned and miniaturized.

Furthermore, by the planar light source device using such a light guide member, since a luminance at the section directly over the luminous device is lowered, a luminance is uniform, a high luminance can be implemented, an unevenness of colors does not occur, and a chromaticity is uniform for the entire face of the planar light source device.

Consequently, in the case in which the planar light source device related to the present invention is used as a display apparatus, in particular, a back light for a liquid crystal display, a display apparatus with a thin type and with a high quality image can be obtained.

BRIEF DESCRIPTION OF THE DRAWINGS

FIG. 6 is a top view schematically showing a shape of the area near around the luminous device in which a light reflecting portion is not formed for a light guide member related to the present invention.

FIG. 10 is a top view showing a fourth embodiment of a planar light source device related to the present invention to which a light guide member related to another embodiment of the present invention is applied.

FIG. 14 is a top view schematically showing a shape of the area near around the luminous device in which a light reflecting portion is not formed for a light guide member related to the present invention.

BEST MODE OF CARRYING OUT THE INVENTION

The embodiments of the present invention will be described below in detail with reference to the drawings.

Figure 1:
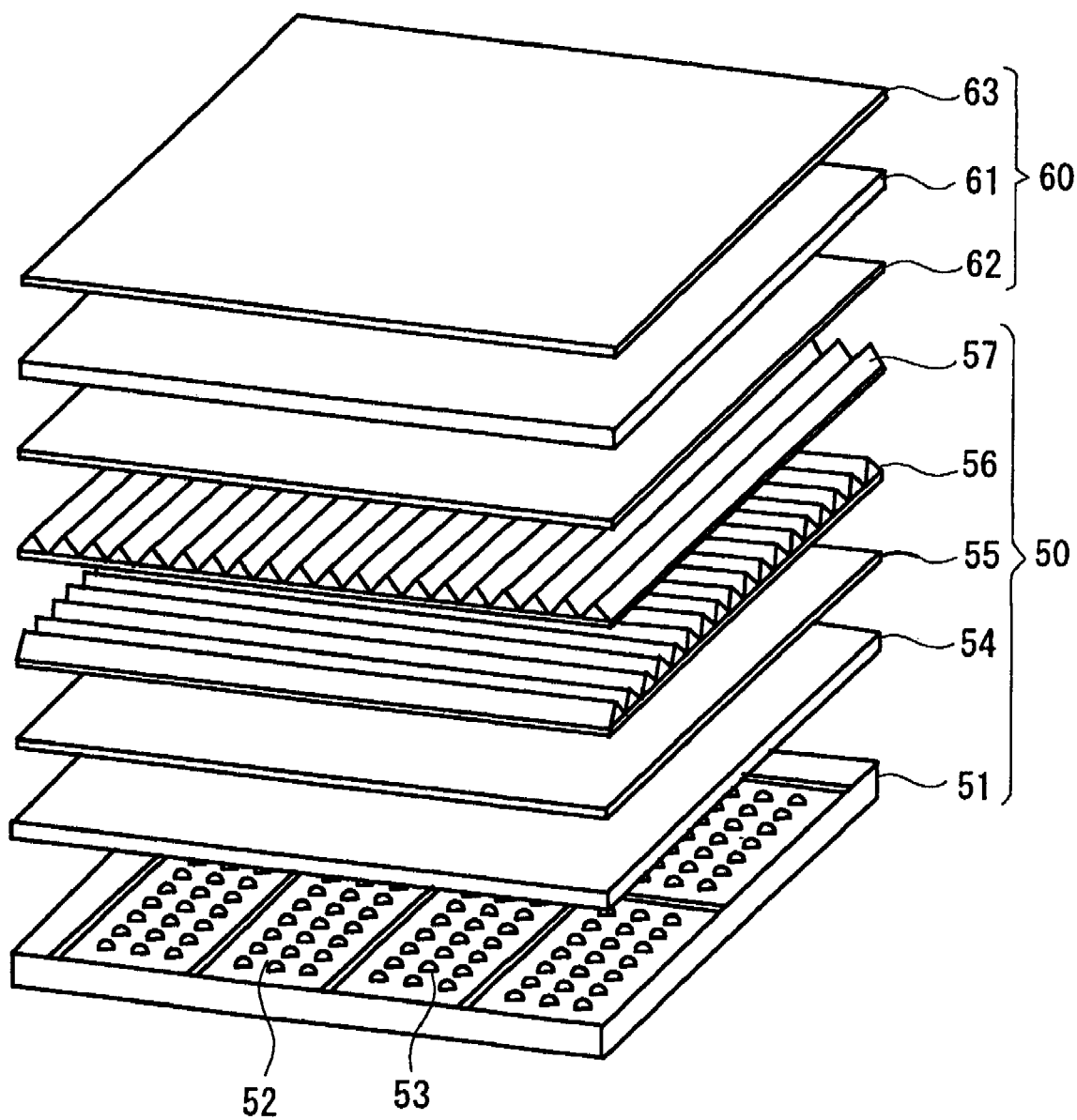
FIG. 1 is a view showing an entire configuration of a typical liquid crystal display apparatus to which the present embodiment is applied.

FIG. 1 is a view showing an entire configuration of an example of a liquid crystal display apparatus to which the present embodiment is applied. A liquid crystal display apparatus to which the present embodiment is applied is provided with as a back light apparatus (back light) 50 of a direct lighting type which comprises a back light frame 51 enclosing a luminous portion and an LED substrate (luminous device mounting substrate) 52 as a substrate on which a plurality of light emitting diodes (LEDs) 53 that are solid luminous devices is arranged as an illuminant. The back light apparatus 50 is provided with a light guide member (plate or sheet) 54 on the LED substrate (mounting substrate) 52. The light guide member, which is characterized by the present invention, is enclosed in the back light frame (chassis) 51.

Figure 25:
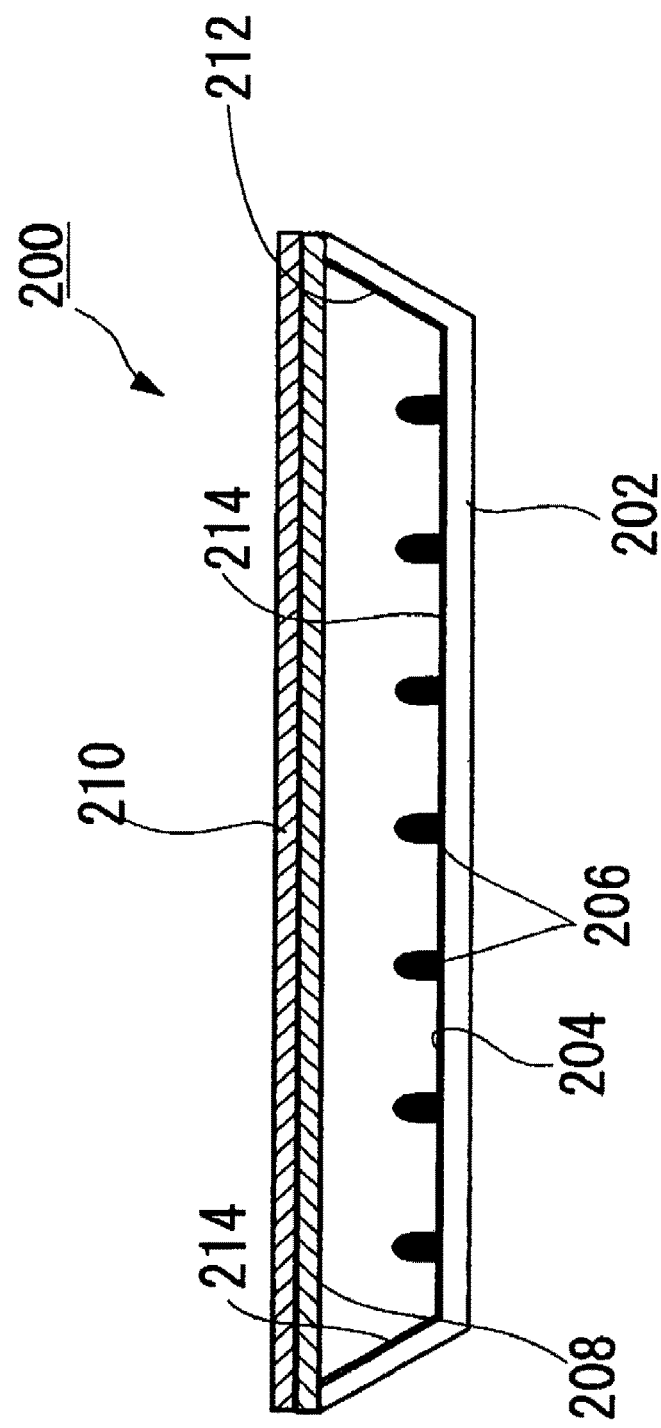
FIG. 25 is a schematic cross-sectional view showing a conventional back light illuminant of a direct lighting type.

A difference from a conventional direct lighting type back light apparatus shown in FIG. 25 is that the light guide member is disposed in a space between a light emitting diode and a diffusing member (plate). In addition, a thickness of the back light is not increased and a space between a light emitting diode and a diffusing member (plate) can be decreased. A diffusing member (plate or sheet) 55 for scattering and diffusing lights to implement a uniform luminance on the entire face and prism sheets 56 and 57 that are diffraction grating films having a forward condensing effect are disposed as laminates of an optical compensating sheet on the light guide member. Moreover, a liquid crystal display module 60 is provided with a liquid crystal panel 61 in which a liquid crystal is interposed by two glass substrates and polarizing plates (polarizing filters) 62 and 63 laminated on each of the glass substrates of the liquid crystal panel 61 for restricting a light wave vibration to a certain direction. Furthermore, the liquid crystal display apparatus is provided with peripheral members such as a driving LSI although this is not shown in the figure.

The liquid crystal panel 61 contains many kinds of components although these are not shown in the figure. For instance, the liquid crystal panel is provided with two glass substrates, a display electrode, an active device such as a thin film transistor, a liquid crystal, a spacer, a sealing agent, an orientation film, a common electrode, a protection film, and a color filter although these are not shown in the figure.

Moreover, any configuration unit of the back light apparatus 50 can be selected. For instance, only a unit of the back light frame 51 provided with the LED substrate 52 can be called as a back light apparatus (back light), and there can be implemented a flow-through type that does not contain a laminate of an optical compensating sheet such as the diffusing member 53 and the prism sheets 54 and 55.

The back light frame 51 has a chassis structure made of a material such as aluminum, magnesium, iron, or a metal alloy thereof. Moreover, a white polyester film having a performance of a high reflection and so on is bonded to the inside face of the chassis structure, thereby involving a function as a reflector. The chassis structure is provided with a back face portion formed corresponding to the size of the liquid crystal display module 60 and a side face portion surrounding the four edges of the back face portion. If necessary, a heat sink configuration such as a cooling fin for dissipating heat is formed in the back face portion or the side face portion in some cases.

Figure 2:
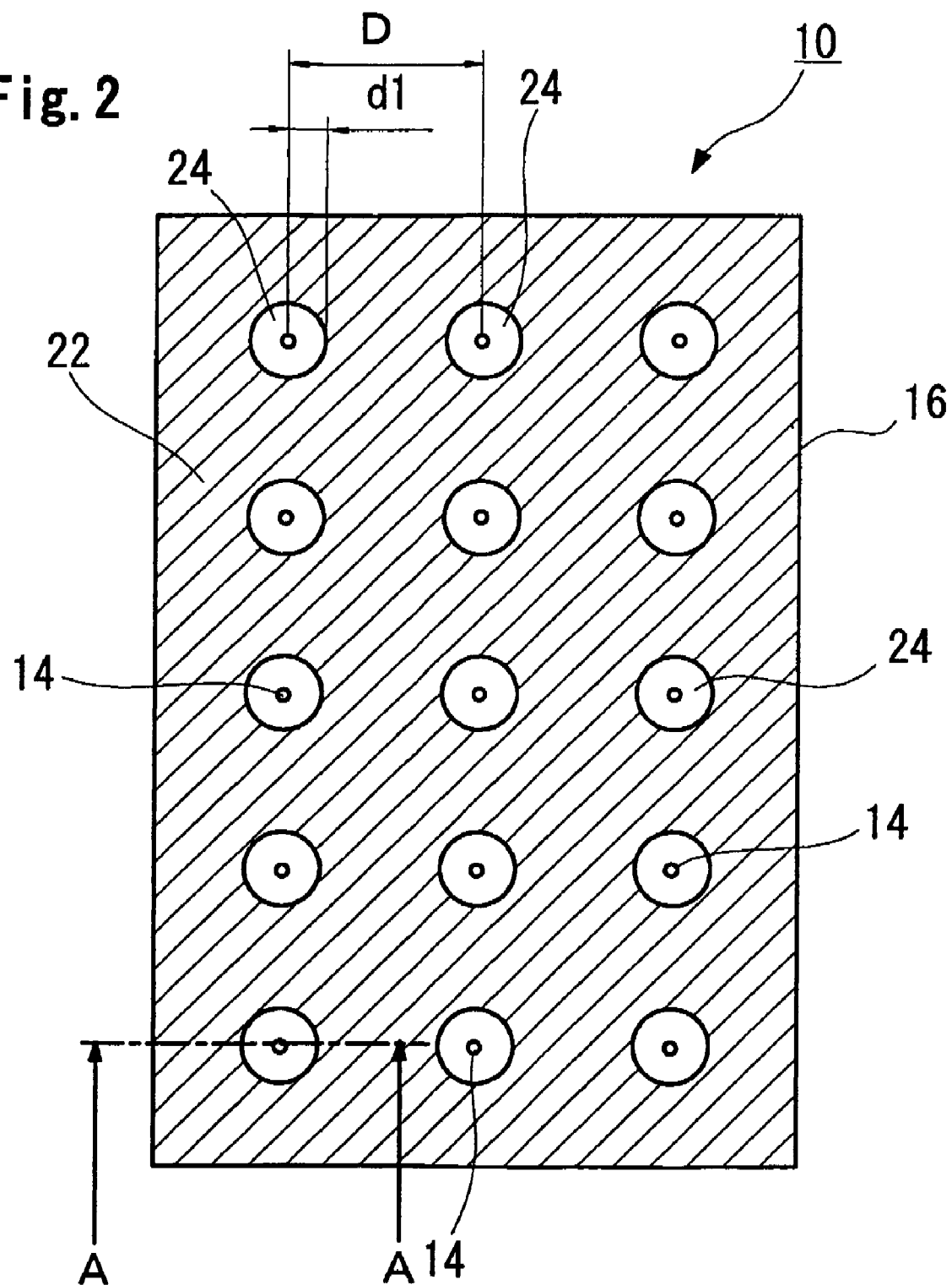
FIG. 2 is a top face view showing a first embodiment of a planar light source device related to the present invention to which a light guide member related to the present invention is applied.
Figure 3:
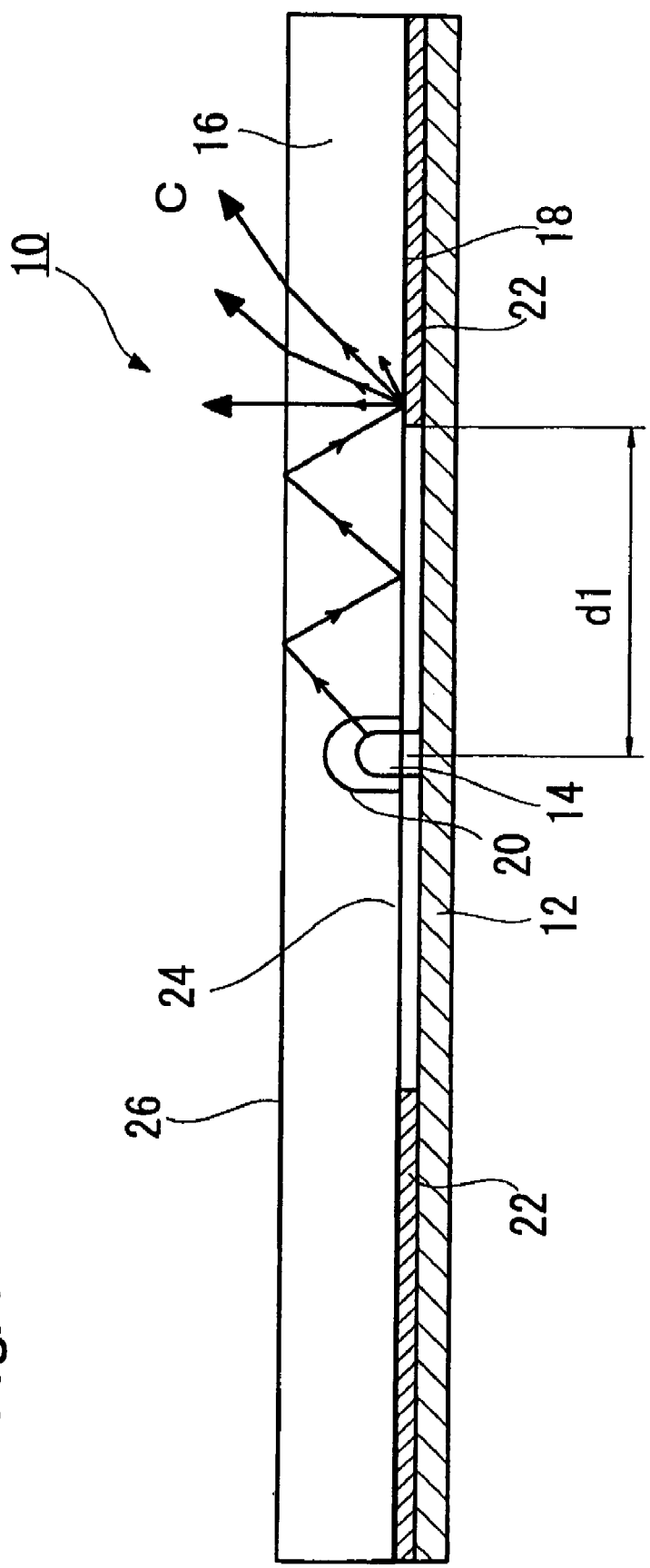
FIG. 3 is a partially enlarged cross-sectional view showing a configuration along the A-A line shown in FIG. 2.

FIG. 2 is a top face view showing a first embodiment of a planar light source device related to the present invention to which a light guide member related to the present invention is applied. FIG. 3 is a partially enlarged cross-sectional view showing a configuration along the A-A line shown in FIG. 2.

In FIGS. 2 and 3, a numeral 10 represents a planar light source device related to the present invention as a whole.

As shown in FIG. 3, a planar light source device 10 related to the present invention is provided with a luminous device mounting substrate 12, and a luminous device 14 such as an LED is mounted on the upper face of the luminous device mounting substrate 12.

As shown in FIG. 2, a plurality of luminous devices 14 is disposed at a constant pitch in an array pattern on the upper face of the luminous device mounting substrate 12.

Moreover, a light guide member 16 made of a transparent resin or the like is disposed over the upper face of the luminous device mounting substrate 12. As shown in FIG. 3, a concave for luminous device 20 is formed on the bottom face 18 of the light guide member 16 at the position corresponding to the luminous device 14, and the luminous device 14 is housed in the concave for luminous device 20.

The shape of the concave for luminous device 20 can be properly modified to a dome shape, a semi-spherical shape, a circular cone shape or the like.

A wiring pattern made of copper or the like is formed on the luminous device mounting substrate 12, thereby controlling a light emission of the luminous device 14 although this is not shown in the figure.

A light guide member 16 comprises a light reflecting portion 22 formed on the bottom face of the light guide member 16 at a position not near around the luminous device 14, and a section in which a light reflecting portion 22 is not formed on the bottom face of the light guide member 16 at a position near around the luminous device 14. Therefore, the strength of a diffusion upward at the bottom face of the light guide member 16 near around the luminous device 14 is smaller than the strength of a diffusion upward at the bottom face of the light guide member 16 provided with a light reflecting portion 22 at the periphery section thereof.

More specifically, in the present embodiment, as shown in FIGS. 2 and 3, a light reflecting portion 22 made of a white paint or the like is formed under the almost entire face of the bottom face 18 of the light guide member 16 except for an area near around the luminous device 14.

Figure 26:
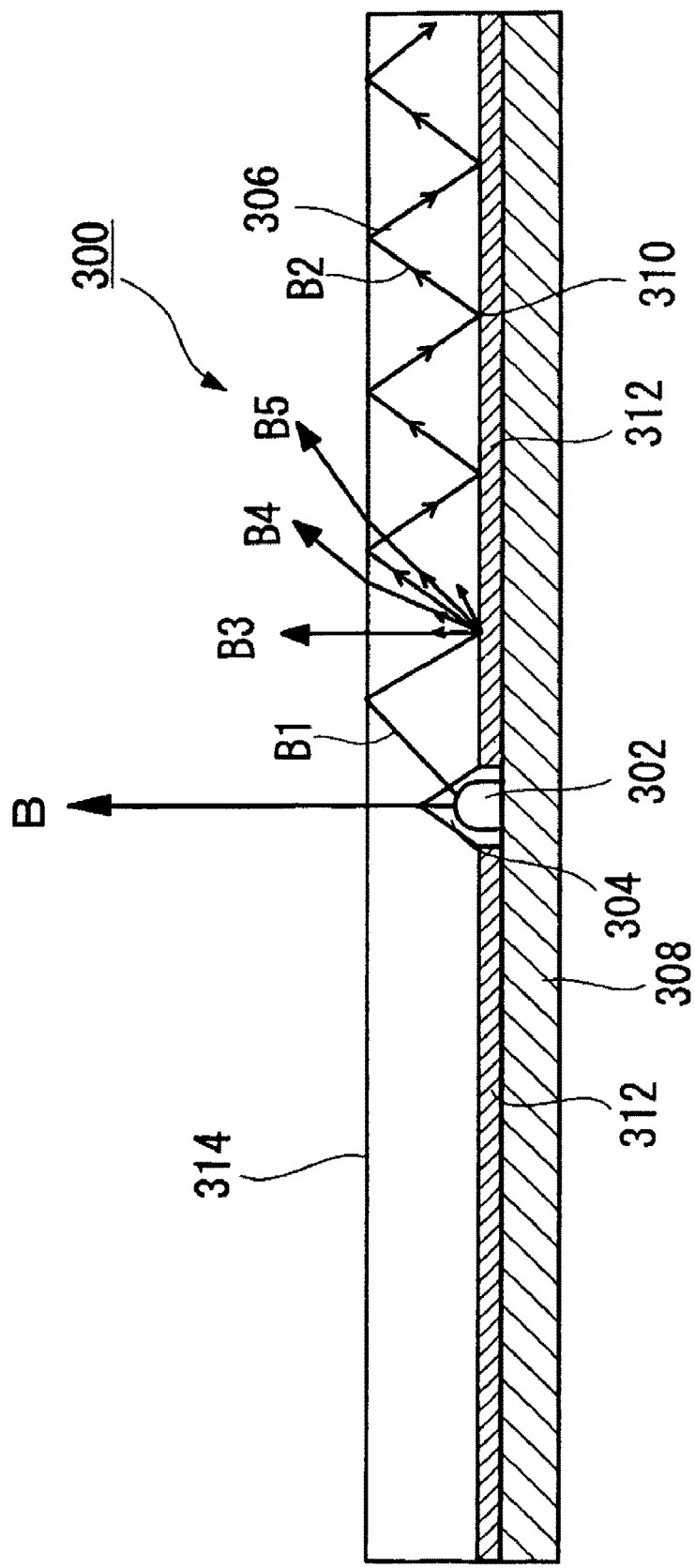
FIG. 26 is a schematic cross-sectional view showing a conventional planar light source device.

As shown in FIG. 26, for a conventional planar light source device 300, as shown by the arrows B, lights emitted from an LED lamp 302 are reflected by a reflecting portion 312 even near around the LED lamp 302 and are guided upward from the upper face 314 of the light guide member 306 in such a manner that the lights are diffusely reflected.

Figure 4:
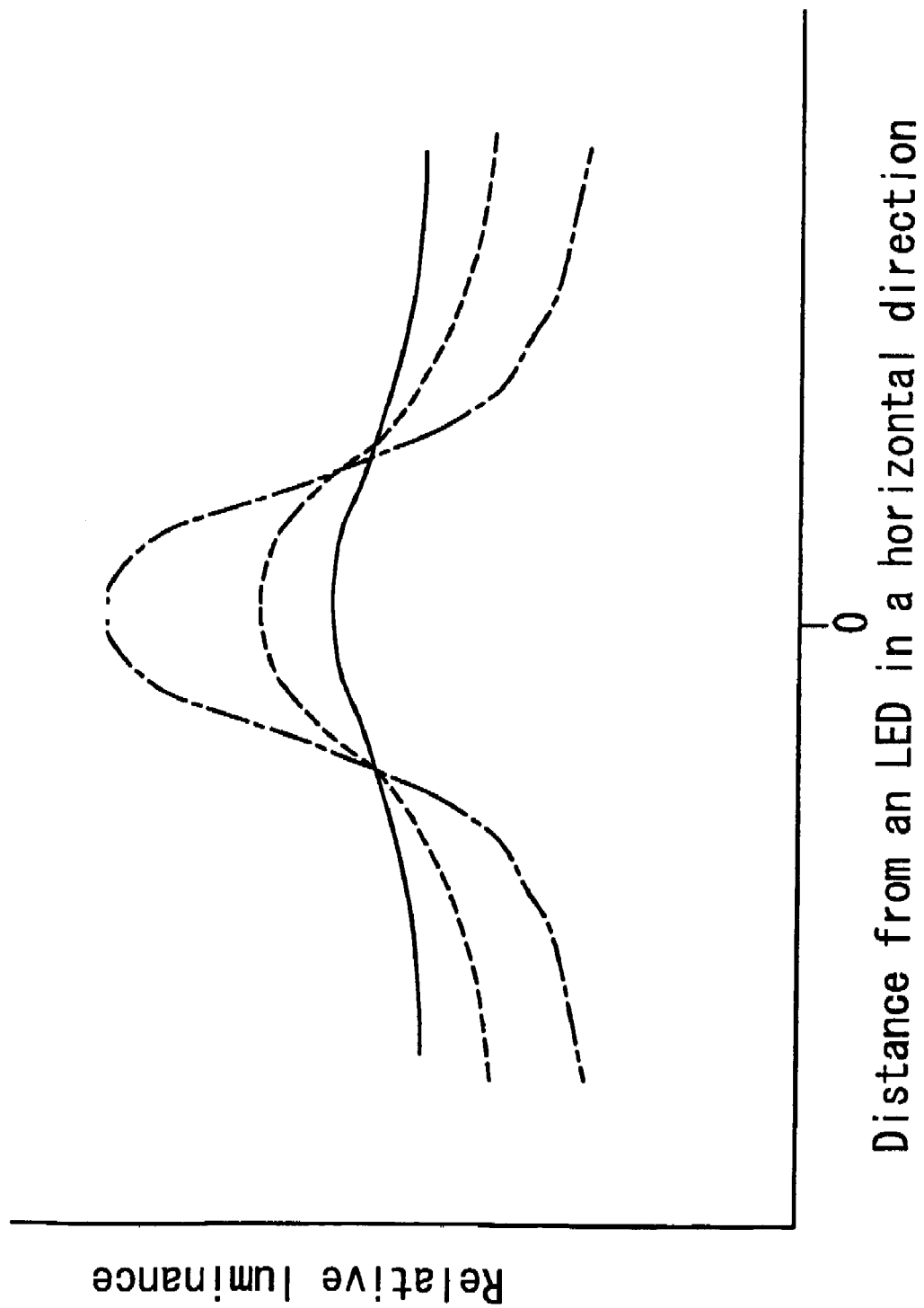
FIG. 4 is a graph showing a distance from an LED in a horizontal direction and a relative luminance.

As a result, as shown by the alternate long and short dash line in the graph of FIG. 4, for a conventional planar light source device 300, an amount of lights emitted from the upper face 314 of the light guide member 306 at the section directly over the LED lamp 302, and a luminance at the section directly over the LED lamp 302 becomes higher.

On the contrary, for a planar light source device 10 related to the present embodiment, since the light reflecting portion 22 is not formed near around the luminous device 14, as shown by the arrow C in FIG. 3, a light emitted from the luminous device 14 is regularly (totally) reflected by the bottom face 18 of the light guide member 16 near around the luminous device 14 and is just guided between the upper face 26 and the bottom face 18 of the light guide member 16. The light is not guided upward from the upper face 26 of the light guide member 16 by a diffusive reflection.

As shown by the arrow C in FIG. 3, the light that has reached the light reflecting portion 22 is diffusely reflected upward from the light guide member 16 by a diffusive reflection.

By the above configuration, as described above, the strength of a diffusion upward at the bottom face of the light guide member 16 near around the luminous device 14 is smaller than the strength of a diffusion upward at the bottom face of the light guide member 16 at the periphery section thereof.

By the above configuration, as shown by the dotted line in the graph of FIG. 4, a luminance around the section directly over the luminous device 14 is decreased as compared with a conventional back light illuminant and a luminance outside the section is increased as compared with a conventional back light illuminant, thereby improving a uniform luminance.

Figure 5:
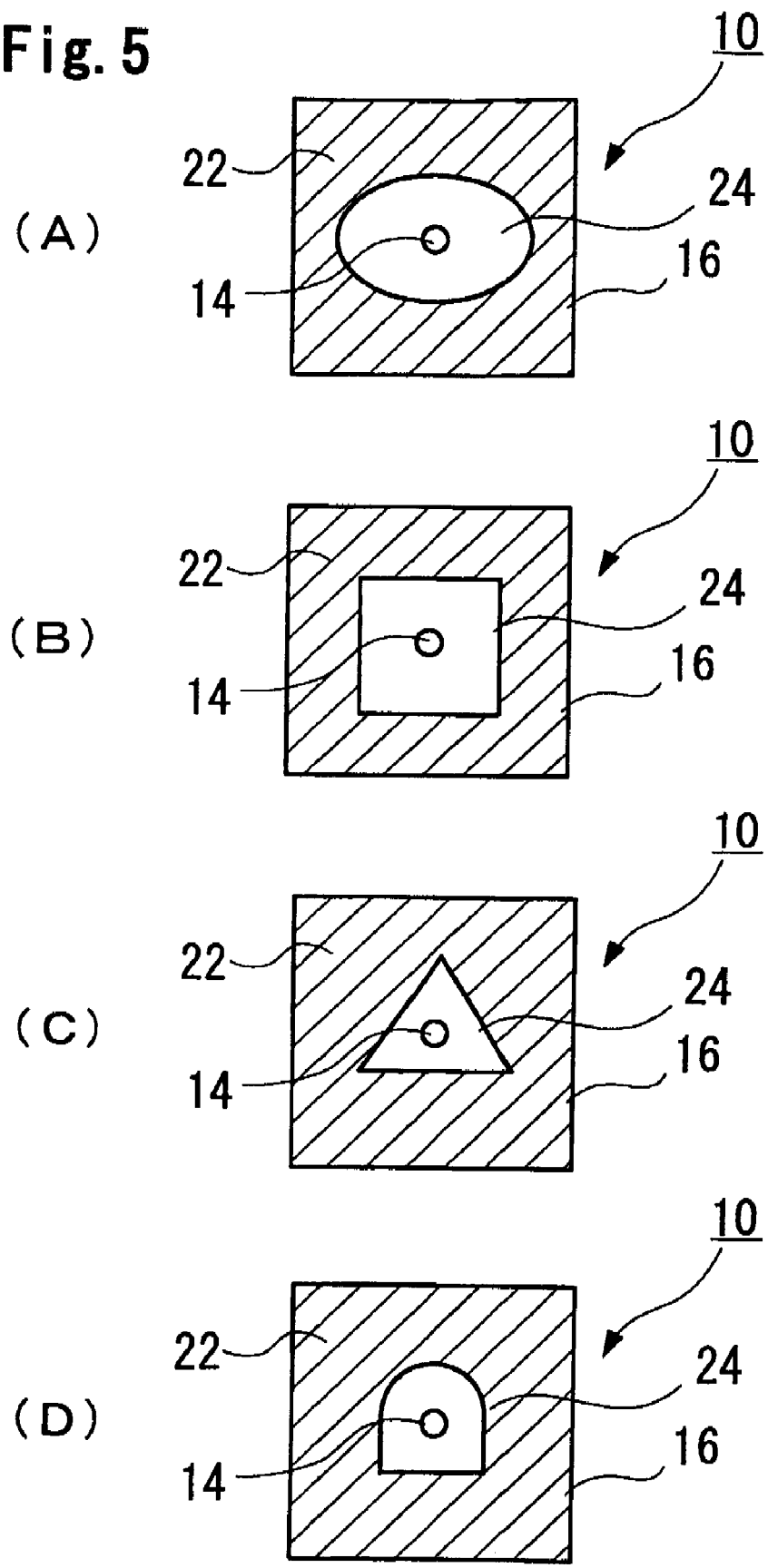
FIG. 5 is a top view schematically showing a shape of the area near around the luminous device in which a light reflecting portion is not formed for a light guide member related to the present invention.

While the area 24 near around the luminous device 14 in which the light reflecting portion 22 is not formed is in a circular shape in the present embodiment in such a manner that a distance from the luminous device 14 to any edge of the area is constant, a shape of the area is not restricted to the above shape. As shown in FIG. 5, a shape of the area can be an ellipse (FIG. 5(A)), a rectangle (FIG. 5(B)), a triangle (FIG. 5(C)), an arch (FIG. 5(D)), a polygon, or other shapes.

Moreover, the area 24 near around the luminous device 14 in which the light reflecting portion 22 is not formed, that is, a distance d1 from the center of the luminous device 14 to a peripheral edge of the area 24 near around the luminous device as shown in FIG. 3 can be specified in such a manner that a luminance can be almost uniform as shown by the solid line in the graph of FIG. 4 corresponding to a kind and a luminance of the luminous device 14, a kind and a thickness of the light guide member 16, and a kind and a film thickness of the light reflecting portion 22. The above area is not restricted in particular.

For instance, in the case in which the luminous device 14 is an LED, the light guide member 16 is a transparent resin plate and has a thickness of 3 mm, and the light reflecting portion 22 is a white paint and has a thickness in the range of 5 to 100 μm, a distance d1 from the luminous device 14 to a peripheral edge of the area near around the luminous device can be approximately 40 mm.

Moreover, as shown in FIG. 2, in the case in which a distance between adjacent luminous devices of a plurality of the luminous devices 14 is D and a uniform distance from the center of the luminous device 14 to a peripheral edge of the area 24 near around the luminous' device is d, it is preferable that D/4 is equivalent to or larger than d.

While the luminous device 14 is not restricted in particular, for instance, an LED is preferable for a back light illuminant of a liquid crystal display since satisfactory color reproducibility, a high speed response, and a high quality image can be implemented.

While a monochromatic LED can be used as an LED, there can be suitably used a unit luminous device in which luminous devices of plural kinds with different luminance colors are combined, for instance, a package of the so-called three-in one type, in which LED chips of the three primary colors of red, green, and blue, that is, an LED chip R emitting a red light, an LED chip G emitting a green light, and an LED chip B emitting a blue light are used, and a white color is generated by mixing these colors.

As the luminous device 14, there can be used a mold package product in which an LED is sealed with a mold resin, or an LED provided with a hemispherical lens on the upper face of the LED.

Even in the case in which the luminous devices 14 of plural kinds with different luminance colors are combined to be used like the three-in one type, as shown in FIG. 6, a shape of the area 24 near around the luminous device 14 can also be an ellipse (FIG. 6(A)), a rectangle (FIG. 6(B)), a triangle (FIG. 6(C)), an arch (FIG. 6(b)), a polygon, or other shapes, in addition to a circle as shown in the embodiment of FIG. 2, corresponding to the disposition shape of the LED chips.

In such a case, although this is not shown in the figure, a unit luminous device can be a unit of one piece of R, two pieces of G, and one piece of B, or a unit of two pieces of R, two pieces of G, and one piece of B, in addition to a unit of one piece of R, one piece of G, and one piece of B as described above, and the combination is not restricted in particular.

Moreover, a unit luminous device is not restricted to three colors of red, green, and blue as described above. For instance, an LED chip with a so-called intermediate color such as yellow, orange, and cyan can be installed on one substrate in order to configure LED chips of four, five, or more colors.

Moreover, the light guide member 16 is not restricted in particular in the case in which a light is propagated in the light guide member 16, and an acrylic resin, a polycarbonate resin, a liquid crystal polymer, and a polystyrene resin can be used for instance for the light guide member 16. A member having a comparatively thick plate shape or a comparatively thin sheet shape can be properly used individually or laminated to be used.

A shape of the concave for luminous device 20 is not restricted in particular and can be, for instance, a circular cone, a pyramid, a circular cylinder, a prism, or a hemisphere.

Moreover, the light reflecting layer 22 is not restricted in particular and can be made of, for instance, a metal foil such as an aluminum foil, a metal thin film such as aluminum, gold, silver, and platinum, or a white ink.

In the case of a metal foil such as an aluminum foil, the metal foil can be bonded by a transparent adhesive. Moreover, in the case of a metal thin film such as aluminum, gold, silver, and platinum, the metal thin film can be formed by a method such as a deposition, a sputtering, and an electroless plating. Furthermore, in the case of a white ink, for instance, an acrylic resin containing titanium dioxide can be used, and the acrylic resin can be coated by a method such as a dispenser, a spray coating, a powder coating, a roll coater, a curtain flow coater, and a paintbrush.

Among the above means, the coating of a white ink is preferable from the viewpoint of easiness in operation.

In this case, a thickness of the white ink is preferably in the range of 5 to 100 μm in consideration of a light reflecting effect.

A light diffusing agent such as resin beads and glass beads can be mixed to the white ink, thereby improving a light diffusion degree.

Figure 7:
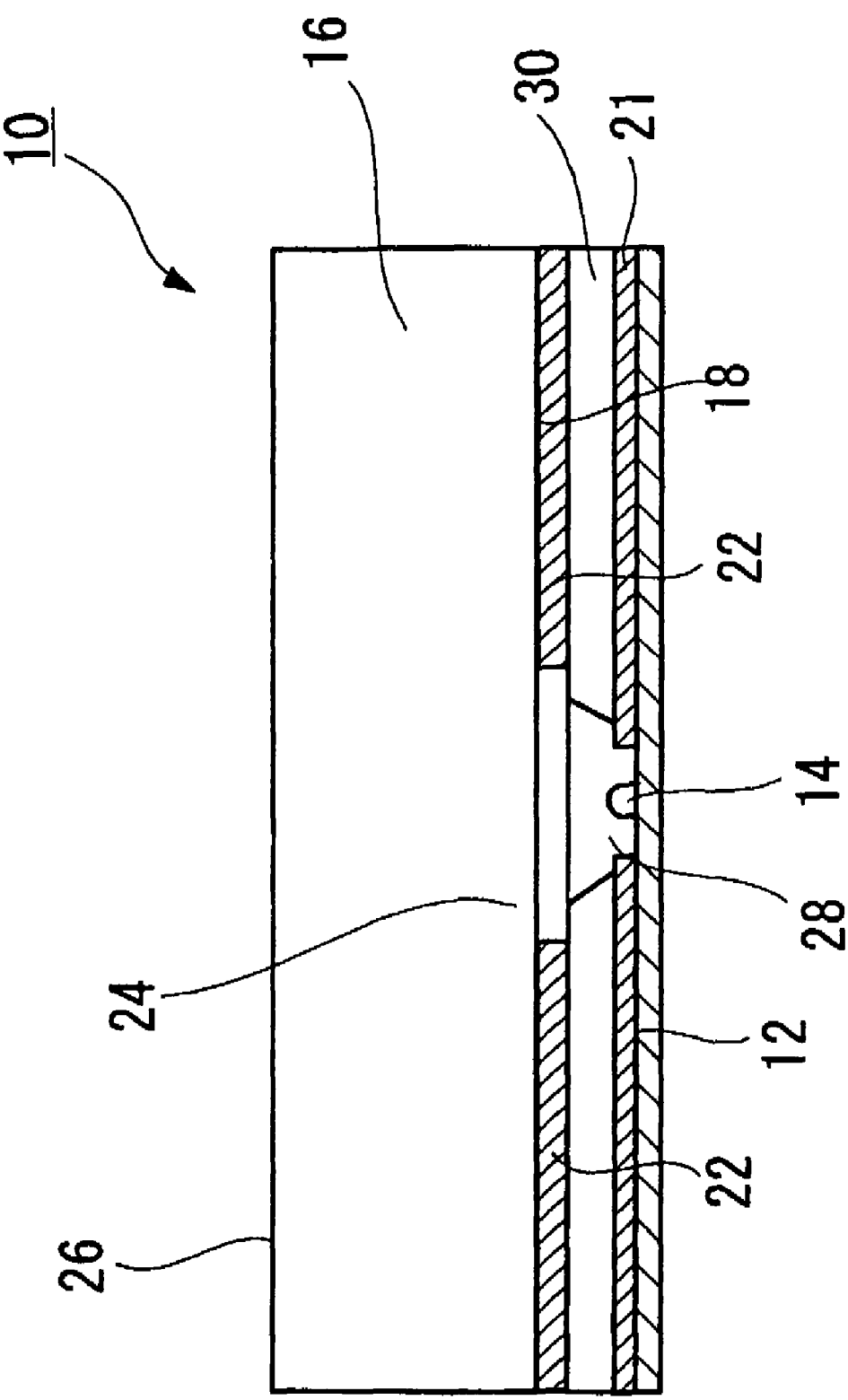
FIG. 7 is a schematic cross-sectional view showing a second embodiment of a planar light source device related to the present invention.

Moreover, in the second embodiment shown in FIG. 7, instead of forming the concave for luminous device 20 on the light guide member 16 side, a concave for luminous device 28 can be formed on the luminous device mounting substrate 12 side, and a reflector 30 can be formed between the luminous device mounting substrate 12 and the light guide member 16 through an insulating layer 21.

In the present embodiment, a plurality of luminous devices 14 is disposed at a constant pitch in an array pattern on the upper face of the luminous device mounting substrate 12. However, the number of the luminous devices 14 (one luminous device is possible as a matter of course) and a disposition shape thereof are not restricted in particular, and can be properly modified. For instance, the luminous devices 14 can also be disposed in a concentric circle pattern or in a staggered pattern.

A planar light source device 10 configured as described above according to the present invention is used as an illuminant such as an advertising lamp, an illumination, and a back light for a liquid crystal display. For instance, in the case in which the planar light source device is used as a back light for a liquid crystal display, as shown in FIG. 1, a liquid crystal display apparatus can be configured by disposing a liquid crystal panel on the upper face of the light guide member 16 through a diffusing sheet and a prism sheet.

Figure 8:
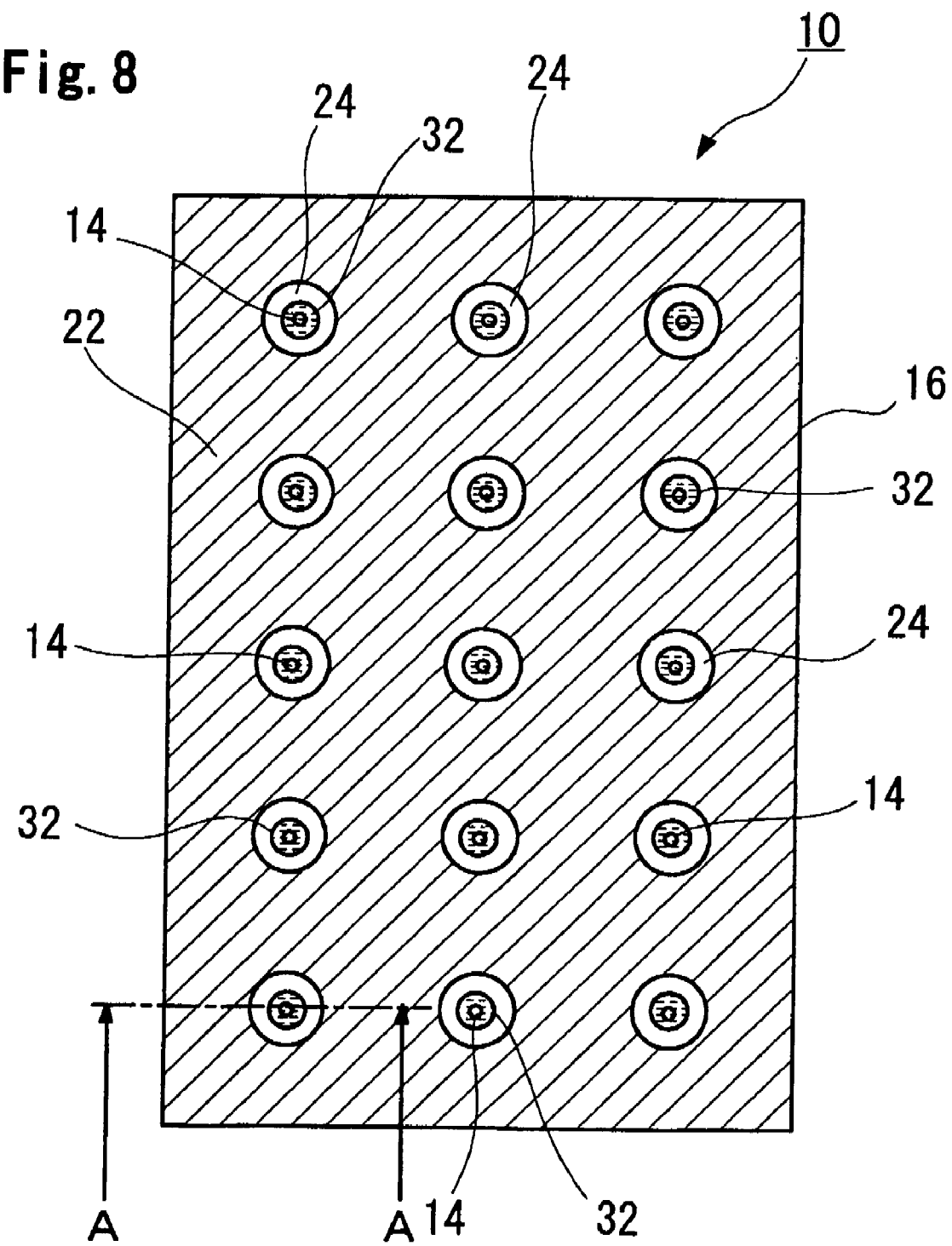
FIG. 8 is a top view showing a third embodiment of the present invention to which a light guide member related to another embodiment of the present invention is applied.
Figure 9:
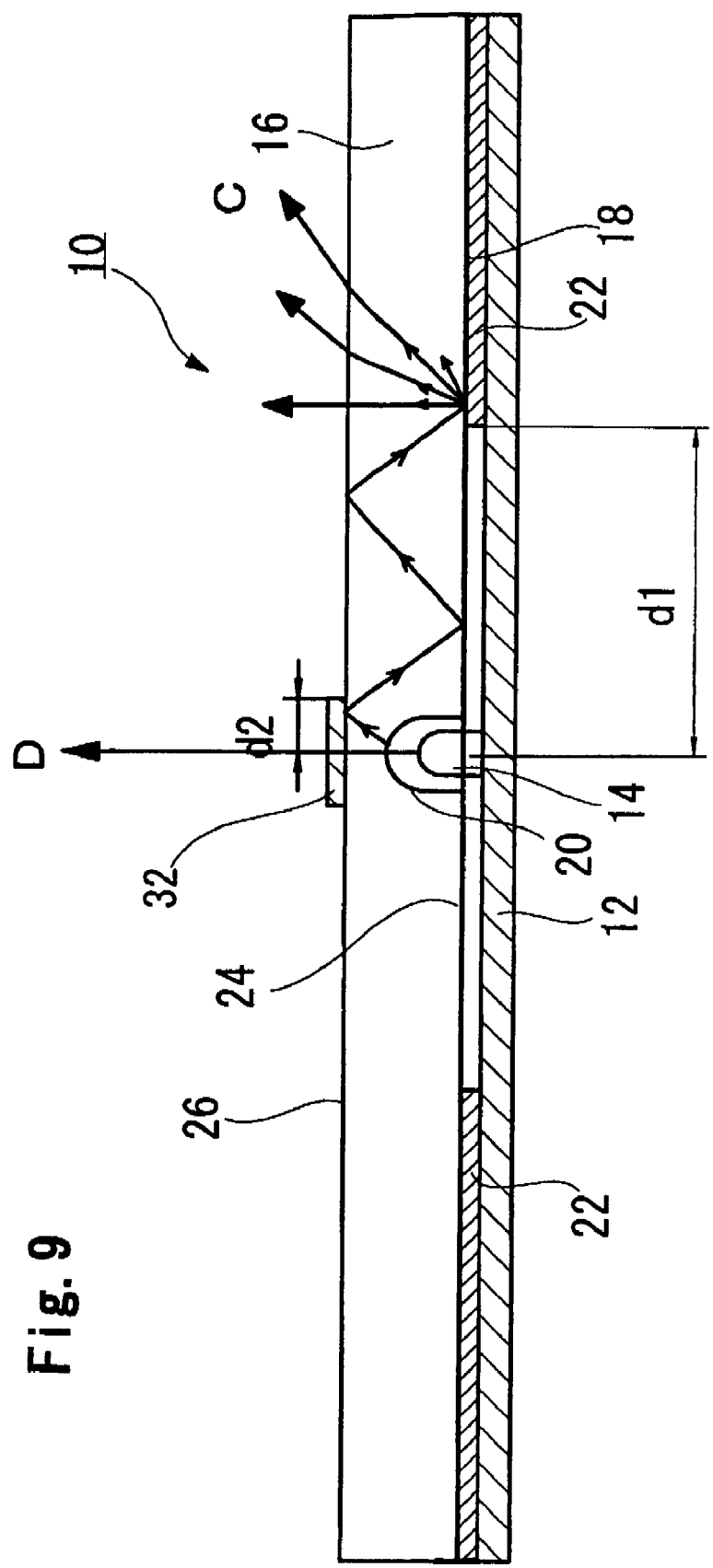
FIG. 9 is a partially enlarged cross-sectional view showing a configuration along the A-A line shown in FIG. 8.

FIG. 8 is a top view showing the third embodiment of a planar light source device related to the present invention to which a light guide plate related to another embodiment of the present invention is applied. FIG. 9 is a partially enlarged cross-sectional view showing a configuration along the A-A line shown in FIG. 8.

Since the configuration of a planar light source device 10 related to the present embodiment is basically equivalent to that of a planar light source device 10 shown in FIGS. 2 and 3, elements equivalent to those illustrated previously are numerically numbered similarly and the detailed descriptions of the equivalent elements are omitted.

As shown in FIGS. 8 and 9, for the planar light source device 10 related to the present embodiment, a light semi-permeable portion 32 in a circular shape is further formed at the position on the upper face of the light guide member 16 corresponding to the luminous device 14, that is, in an area including the section to which the luminous device 14 is projected upward.

A shape of the light semi-permeable portion 32 is not restricted in particular. While the light semi-permeable portion 32 is in a circular shape in the present embodiment in such a manner that a distance from the luminous device 14 to any edge of the light semi-permeable portion 32 is uniform, a shape of the light semi-permeable portion is not restricted to the above shape. Although this is not shown in the figure, similarly to a shape of the area 24 near around the luminous device 14, a shape of the light semi-permeable portion can be an ellipse, a rectangle, a triangle, an arch, a polygon, or other shapes.

Moreover, the light semi-permeable portion, that is, a distance d2 from the luminous device 14 to a peripheral edge of the light semi-permeable portion 32 as shown in FIG. 9 can be specified in such a manner that a luminance can be almost uniform as shown by the solid line in the graph of FIG. 4 corresponding to a kind and an illuminance of the luminous device 14, a kind and a thickness of the light guide member 16, a kind and a film thickness of the light reflecting portion 22, and a distance d1 from the luminous device 14 to a peripheral edge of the area 24 near around the luminous device 14. The above distance d2 is not restricted in particular.

For instance, in the case in which the luminous device 14 is an LED, the light guide member 16 is a transparent resin plate and has a thickness of 3 mm, the light reflecting portion 22 is a white paint and has a thickness in the range of 5 to 100 μm, and a distance d1 from the luminous device 14 to a peripheral edge of the area 24 near around the luminous device 14 is 40 mm, a distance d2 from the luminous device is preferably in the range of 2 to 30 mm.

The light semi-permeable portion 32 is for partial reflection of a light emitted from the luminous device 14, and the reflection ratio of a light is preferably in the range of 50 to 95%, and more preferably in the range of 80 to 95%.

Moreover, the light semi-permeable portion 32 is not restricted in particular and can be made of, for instance, a metal thin film such as aluminum, gold, silver, and platinum, or a white ink.

In the case of a metal thin film such as aluminum, gold, silver, and platinum, the metal thin film can be formed by a method such as a deposition, a sputtering, and an electroless plating. Moreover, in the case of a white ink, for instance, an acrylic resin containing titanium dioxide can be used, and the acrylic resin can be coated by a method such as a dispenser and a printing.

Among the above means, the coating of a white ink is easy and preferable in consideration of operating characteristics.

In this case in which both the light semi-permeable portion 32 and the light reflecting portion 22 are made of a white ink, a film thickness of the light semi-permeable portion 32 is adjusted to be thin in such a manner that part of lights permeate in the light semi-permeable portion, and a film thickness of the light reflecting portion 22 is adjusted to be thick in such a manner that no lights permeate in the light reflecting portion.

By the above configuration, as shown by the arrow D in FIG. 9, a light guided from the luminous device 14 to the upper face of the light guide member 16 directly over the luminous device 14 passes through the light semi-permeable portion 32 and is attenuated, thereby decreasing a luminance at this section.

By the above configuration, as shown by the solid line in the graph of FIG. 4, a luminance around the section directly over the luminous device 14 is decreased as compared with a conventional back light illuminant and a planar light source device 10 related to the embodiment shown in FIGS. 2 and 3, thereby obtaining a uniform luminance.

FIG. 10 is a top view showing the fourth embodiment of a planar light source device related to the present invention to which a light guide member related to another embodiment of the present invention is applied.

Since the configuration of a planar light source device 10 related to the present embodiment is basically equivalent to that of a planar light source device 10 shown in FIGS. 2 and 3, elements equivalent to those illustrated previously are numerically numbered similarly and the detailed descriptions of the equivalent elements are omitted.

In the planar light source device 10 related to the present embodiment, as shown in FIG. 10, a light scattering dot pattern is formed in the area 24 near around the luminous device 14 on the bottom face 18 of the light guide member 16.

The light scattering dot pattern is formed in such a manner that a dot density of the light reflecting portion in a dot shape is lower at a section closer to the luminous device.

By forming a dot pattern in the area 24 near around the luminous device 14 on the bottom face 18 of the light guide member 16 as described above, there can be relaxed a gap of a diffusion strength at the boundary between the area 24 near around the luminous device 14 and the light reflecting portion 22.

While the dot printing pattern is not restricted in particular, the dot printing pattern is a circular pattern of which the center is the position directly over the luminous device 14 and in which a strength of a diffusion upward from the light guide member 16 is minimum at the center of the dot pattern and is larger at a position closer to the periphery.

Such a light scattering dot can be formed by the dot printing of a scattering ink or an integral molding with the light guide member 16.

The scattering ink is not restricted in particular and there can be used, for instance, an ink containing resin beads or glass beads, or the above described white ink.

In the planar light source device 10 having such a configuration, a luminance around the section directly over the luminous device 14 is decreased, thereby obtaining a uniform luminance.

Figure 11:
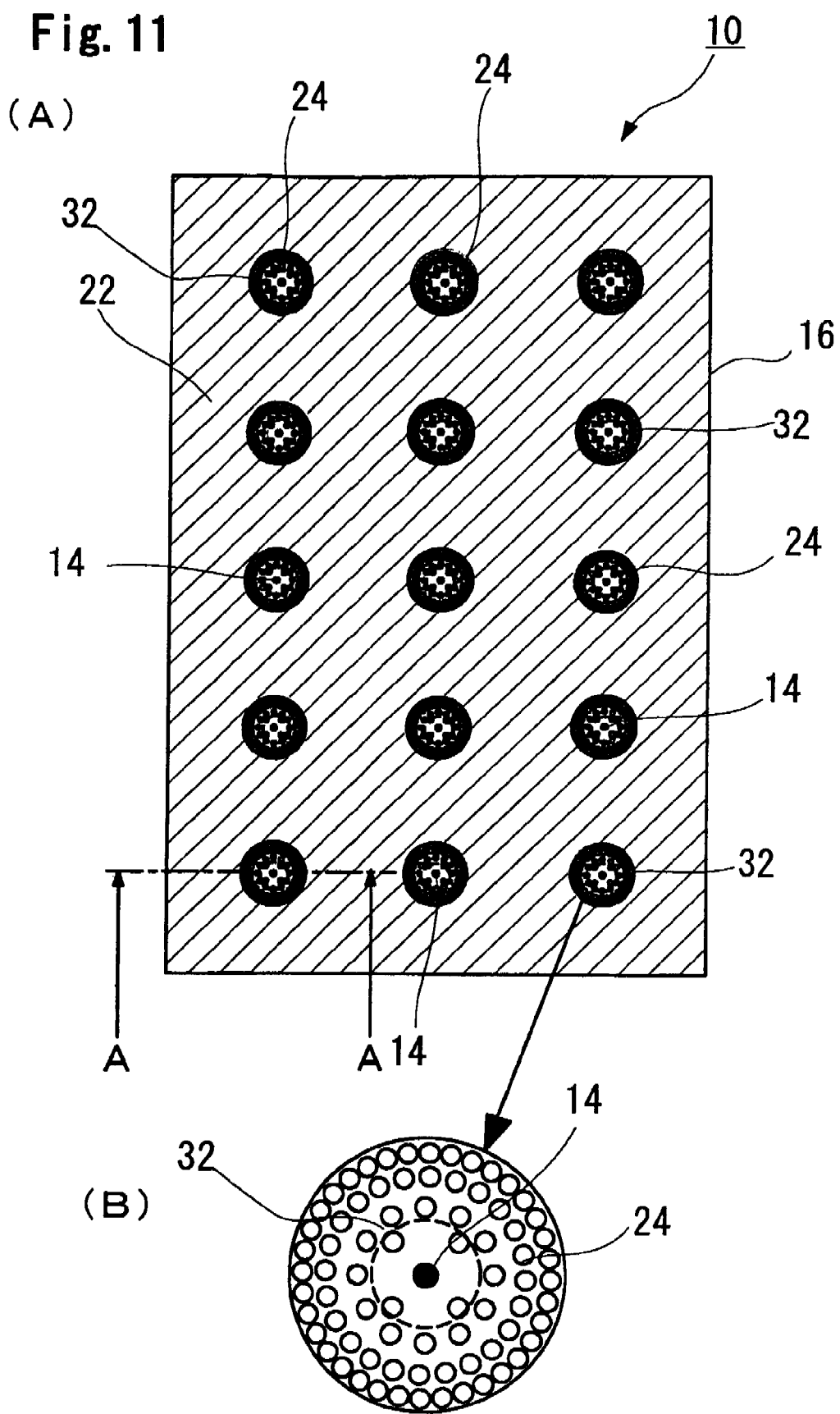
FIG. 11 is a top view showing a fifth embodiment of a planar light source device related to the present invention to which a light guide member related to another embodiment of the present invention is applied.

Even in this case, in the fifth embodiment as shown in FIG. 11, similarly to the planar light source device 10 related to the embodiment shown in FIGS. 8 and 9, a light semi-permeable portion 32 in a circular shape can be formed at the position on the upper face of the light guide member 16 corresponding to the luminous device 14, that is, at the position directly over the luminous device 14.

While the light scattering dot pattern is formed in the area 24 near around the luminous device 14 on the bottom face 18 of the light guide member 16 in the present embodiment, minute uneven shapes can also be formed on the bottom face 18 of the light guide member 16 in order to control a strength of a diffusion in place of the dot shape.

Figure 12:
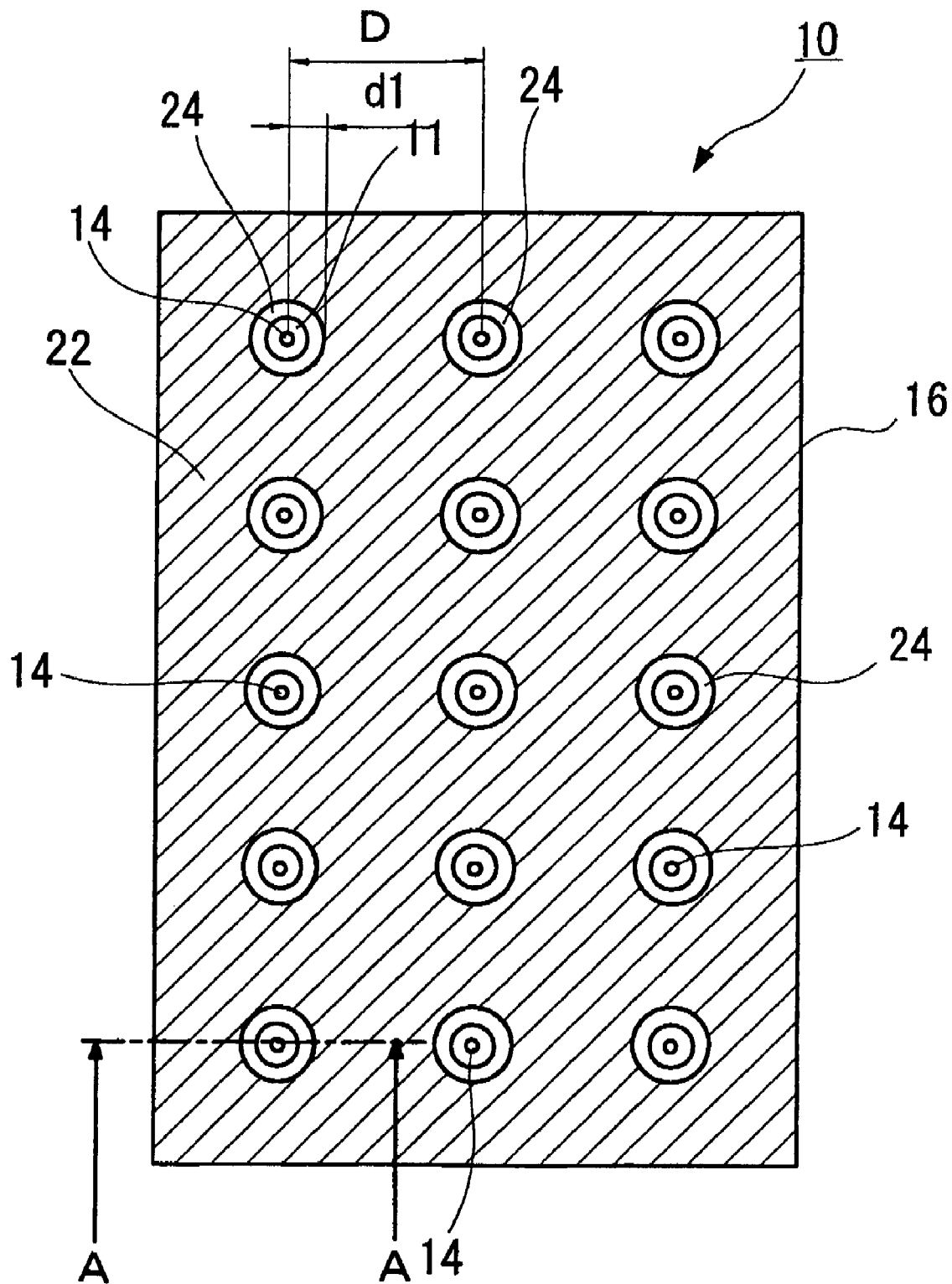
FIG. 12 is a top view showing a sixth embodiment of a planar light source device related to the present invention to which a light guide member related to the present invention is applied.
Figure 13:
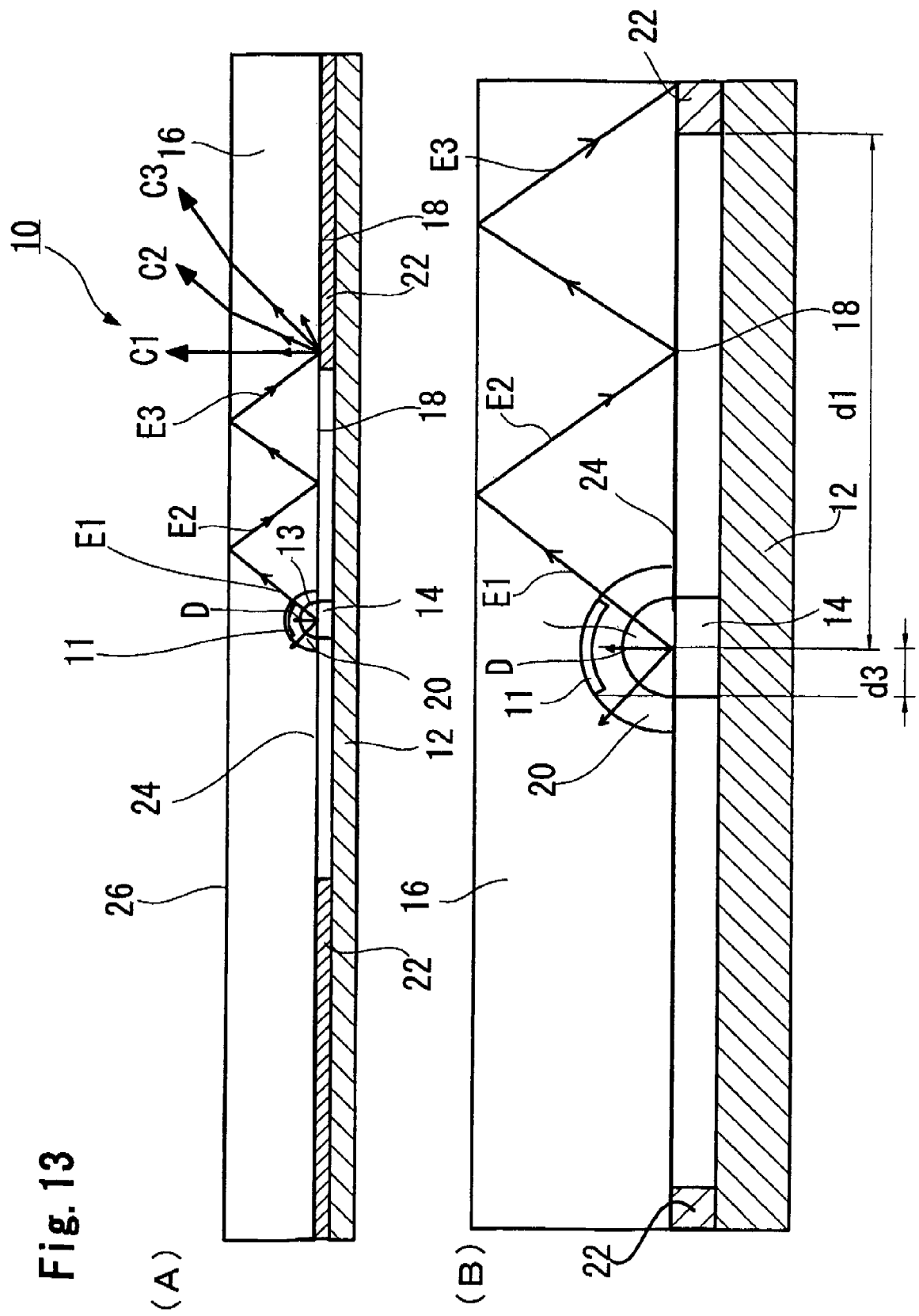
FIG. 13 is a partially enlarged cross-sectional view showing a configuration along the A-A line shown in FIG. 12.

FIG. 12 is a top view showing the sixth embodiment of a planar light source device related to the present invention to which a light guide member related to another embodiment of the present invention is applied. FIG. 13 is a partially enlarged cross-sectional view showing a configuration along the A-A line shown in FIG. 12.

Since the configuration of a planar light source device 10 related to the present embodiment is basically equivalent to that of a planar light source device 10 shown in FIGS. 2 and 3, elements equivalent to those illustrated previously are numerically numbered similarly.

In FIGS. 12 and 13, a numeral 10 represents a planar light source device related to the present invention as a whole.

As shown in FIG. 13, a planar light source device 10 related to the present invention is provided with a luminous device mounting substrate 12, and a luminous device 14 such as an LED is mounted on the upper face of the luminous device mounting substrate 12.

As shown in FIG. 12, a plurality of luminous devices 14 is disposed at a constant pitch in an array pattern on the upper face of the luminous device mounting substrate 12.

Moreover, a light guide member 16 made of a transparent resin or the like is disposed over the upper face of the luminous device mounting substrate 12. As shown in FIG. 13, a concave for luminous device 20 is formed on the bottom face 18 of the light guide member 16 at the position corresponding to the luminous device 14, and the luminous device 14 is housed in the concave for luminous device 20.

The shape of the concave for luminous device 20 can be properly modified to a dome shape, a semi-spherical shape, a circular cone shape or the like. A wiring pattern made of copper or the like is formed on the luminous device mounting substrate 12, thereby controlling a light emission of the luminous device 14 although this is not shown in the figure.

Moreover, the light guide member 16 is configured in such a manner that the strength of a diffusion light upward at the bottom face of the light guide member 16 near around the luminous device 14 is smaller than the strength of a diffusion light upward at the bottom face of the light guide member 16 provided with the light reflecting portion 22 on the peripheral section thereof.

More specifically, in the present embodiment, as shown in FIGS. 12 and 13, a light reflecting portion 22 having a function for reflecting and diffusing a light is formed on the bottom face 18 of the light guide plate 16 except for an area near around the luminous device 14.

Moreover, as shown in FIG. 13, there is formed a light semi-permeable portion 11, which has a function for reflecting and diffusing a light and in which part of lights permeates (light permeability: approximately 10 to 50%), on the surface on the concave of the concave for luminous device 20 at the position over the luminous device 14.

Here, "position over the luminous device" means an area to which an opposite luminous device 14 (including a lens 13 in the case in which the lens is formed) is projected upward, that is, an area including at least a part at the section directly over the luminous device 14. FIG. 13 corresponds to the case in which the light semi-permeable portion 11 is formed in an area almost equivalent to an entire area directly over the luminous device 14 (lens 13) at the surface on the concave of the concave for luminous device 20.

However, the light semi-permeable portion 11 can be disposed at the position corresponding to the luminous device 14 in the surface on the concave of the concave for luminous device 20 in the light guide member 16. More specifically, the light semi-permeable layer 11 can be formed not only at the position directly over the luminous device 14 as described above (it is not necessary to form the layer on the entire face directly over the luminous device), but also in an area larger than that including the position directly over the luminous device 14 in the range in which a light emitted from the luminous device 14 and a light diffused and reflected by the light semi-permeable portion 11 are emitted outside from the concave for luminous device 20.

Moreover, a range in which the light semi-permeable portion 11 is formed, that is, a distance d3 from the luminous device 14 to a peripheral edge of the light semi-permeable portion 11 as shown in FIG. 13 can be specified in such a manner that a luminance can be almost uniform as shown by the solid line in the graph of FIG. 4 corresponding to a kind and an illuminance of the luminous device 14, a kind and a thickness of the light guide member 16, a kind and a film thickness of the light reflecting portion 22, a distance d1 from the luminous device 14 to a peripheral edge of the area 24 near around the luminous device 14, and a shape of the concave for luminous device 20. The above range is not restricted in particular.

A lens 13 is formed on the luminous device 14 at the section fitted into the concave for luminous device 20. However, it is also possible to form no lens 13 as a matter of course.

As shown in FIG. 26, for a conventional planar light source device 300, as shown by the arrows B, lights emitted from an LED lamp 302 are reflected by a reflecting layer 312 even near around the LED lamp 302 and are guided upward from the upper face 314 of the light guide member 306 in such a manner that the lights are diffusely reflected.

As a result, as shown by the alternate long and short dash line in the graph of FIG. 4, for a conventional planar light source device 300, an amount of lights emitted from the upper face 314 of the light guide member 306 at the section directly over the LED lamp 302, and a luminance at the section directly over the LED lamp 302 becomes higher.

On the contrary, for a planar light source device 10 related to the present embodiment, there is formed a light semi-permeable portion 11 on the surface on the concave of the concave for luminous device 20 in the light guide member 16. Consequently, as shown in FIG. 13(B), a light E1 that has been emitted from the luminous device 14 and from the section in which the light semi-permeable portion 11 does not exist is reflected at an upper face 26 of the light guide member 16 as shown by the arrow E2, and a reflection is repeated between the upper face 26 and the bottom face 18 of the light guide member 16. Then, the light reaches a light reflecting portion 22 as shown by the arrow E3 in FIG. 13(A), and is diffused and reflected as shown by the arrows C1 to C3 in FIG. 13(A). Finally, the light is diffused and reflected upward from the light guide member.

Moreover, a light D emitted directly upward from the luminous device 14 is reduced by the light semi-permeable portion 11. As a result, lights that are emitted from the upper face of the light guide member 16 are reduced.

Consequently, a luminance at a position directly over the luminous device 14 in the light guide member 16 can be suppressed.

Furthermore, since the light reflecting portion 22 is not formed on the bottom face of the light guide member near around the luminous device 14, as shown by the arrow E1 in FIG. 13, a light emitted from the luminous device 14 is regularly (totally) reflected by the bottom face 18 of the light guide member 16 near around the luminous device 14 as shown by the arrow E2 and is just guided between the upper face 26 and the bottom face 18 of the light guide member 16. The light is not guided upward from the upper face 26 of the light guide member 16 by a diffusive reflection.

The light that has reached the light reflecting portion 22 as shown by the arrow E3 in FIG. 13 is diffusely reflected upward from the light guide member by a diffusive reflection as shown by the arrows C1 to C3.

By the above configuration, as described above, the strength of diffusion upward at the bottom face of the light guide member 16 near around the luminous device 14 is smaller than that at the bottom face of the light guide member provided with the light reflecting portion 22 at the peripheral section thereof.

By the above configuration, as shown by the dotted line in the graph of FIG. 4, a luminance around the section directly over the luminous device 14 is decreased as compared with a conventional back light illuminant and a luminance outside the section is increased as compared with a conventional back light illuminant instead, thereby improving a uniform luminance.

While the area 24 near around the luminous device 14 in which the light reflecting portion 22 is not formed has a circular shape in the present embodiment in such a manner that a distance from the luminous device 14 to any edge of the area is uniform, a shape of the area is not restricted to the above shape. As shown in FIG. 14, the shape can be an ellipse (FIG. 14(A)), a rectangle (FIG. 14(B)), a triangle (FIG. 14(C)), an arch (FIG. 14(D)), a polygon, or other shapes.

Moreover, the area 24 near around the luminous device 14 in which the light reflecting portion 22 is not formed, that is, a distance d1 from the luminous device 14 to a peripheral edge of the area 24 near around the luminous device as shown in FIG. 13 can be specified in such a manner that a luminance can be almost uniform as shown by the solid line in the graph of FIG. 4 corresponding to a kind and an illuminance of the luminous device 14, a kind and a thickness of the light guide member 16, and a kind and a film thickness of the light reflecting portion 22. The above distance is not restricted in particular.

For instance, in the case in which the luminous device 14 is an LED, the light guide member 16 is a transparent resin plate and has a thickness of 3 mm, and the light reflecting layer 22 is a white paint and has a thickness in the range of 5 to 100 μm, a distance d1 from the luminous device 14 to a peripheral edge of the area 24 near around the luminous device can be approximately 40 mm.

Moreover, in the case in which a distance between the centers of adjacent luminous devices of a plurality of the luminous devices 14 is D and a uniform distance from the luminous device 14 to a peripheral edge of the area 24 near around the luminous device is d, it is preferable that D/4 is equivalent to or larger than d.

While the luminous device 14 is not restricted in particular, for instance, an LED is preferable for a back light illuminant of a liquid crystal display since satisfactory color reproducibility, a high speed response, and a high quality image can be implemented.

While a monochromatic LED can be used as an LED, it is preferable to use a unit luminous device in which luminous devices of plural kinds with different luminance colors are combined, for instance, a so-called three-in one package, in which LED chips of the three primary colors of red, green, and blue, that is, an LED chip R emitting a red light, an LED chip G emitting a green light, and an LED chip B emitting a blue light are used, and a white color is generated by mixing these colors.

Figure 15:
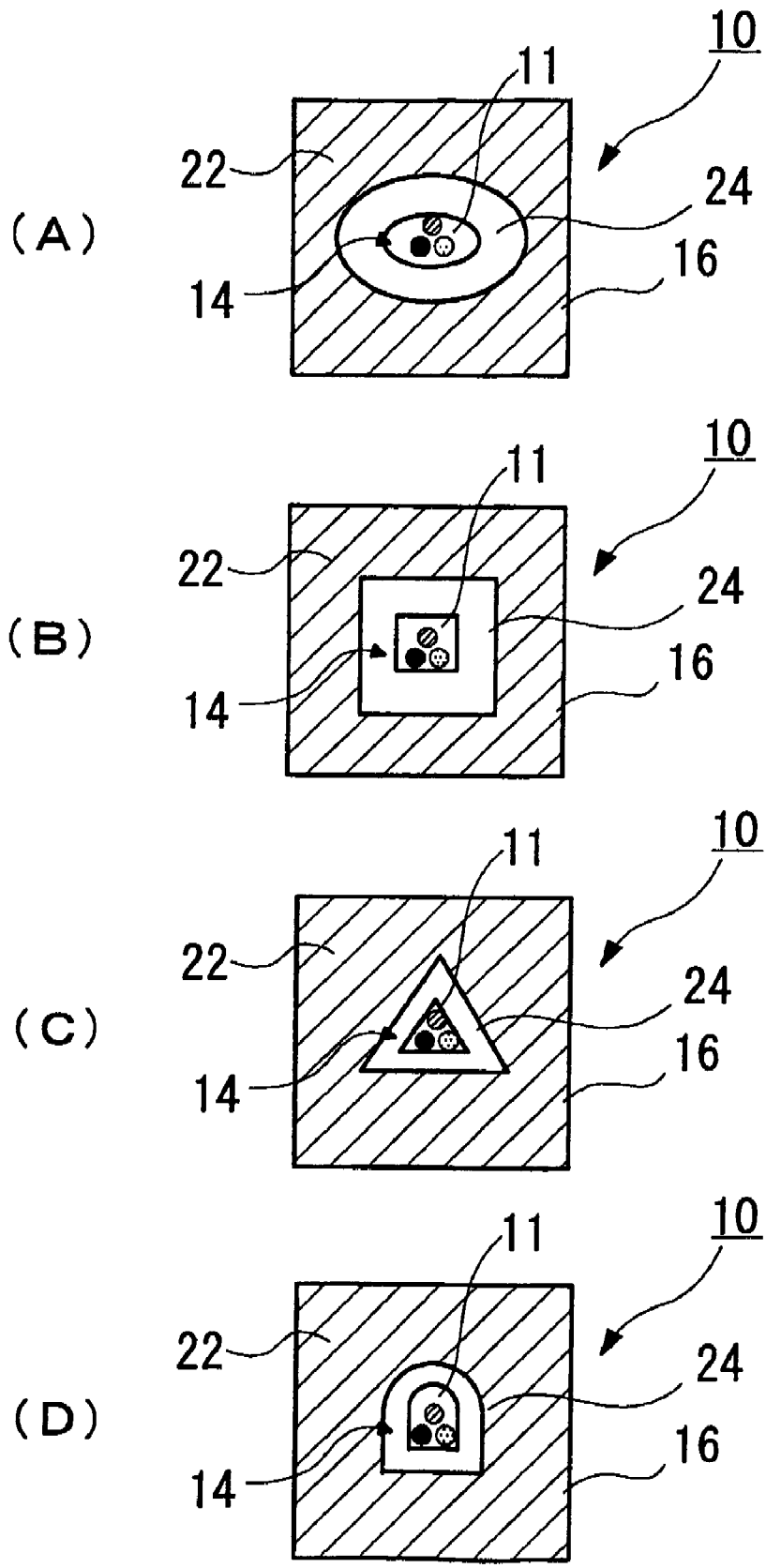
FIG. 15 is a top view schematically showing a shape of the area near around the luminous device in which a light reflecting portion is not formed for a light guide member related to the present invention.

Even in the case in which the luminous devices 14 of plural kinds with different luminance colors are combined to be used like the three-in one type, as shown in FIG. 15, a shape of the area 24 near around the luminous device can also be an ellipse (FIG. 15(A)), a rectangle (FIG. 15(B)), a triangle (FIG. 15(C)), an arch (FIG. 15(D)), a polygon, or other shapes, in addition to a circle as shown in the embodiment of FIG. 12, corresponding to the disposition shape of the LED chips.

In such a case, although this is not shown in the figure, a unit luminous device can be a unit of one piece of R, two pieces of G, and one piece of B, or a unit of two pieces of R, two pieces of G, and one piece of B, in addition to a unit of one piece of R, one piece of G, and one piece of B as described above, and the combination is not restricted in particular.

Moreover, a unit luminous device is not restricted to three colors of red, green, and blue as described above. For instance, an LED chip with a so-called intermediate color such as yellow, orange, and cyan can be installed on one substrate in order to configure LED chips of four, five, or more colors.

Moreover, the light guide member 16 is not restricted in particular in the case in which a light is propagated in the light guide member 16, and an acrylic resin, a polycarbonate resin, a liquid crystal polymer, and a polystyrene resin can be used for instance for the light guide member 16.

Moreover, the light semi-permeable portion 11 is not restricted in particular in the case in which the light semi-permeable portion 11 has a function for reflecting and diffusing a light and part of lights permeates in the light semi-permeable portion 11 (light permeability: approximately 10 to 50%), and can be made of, for instance, a metal foil such as an aluminum foil, a metal thin film such as aluminum, gold, silver, and platinum, or a white ink.

Furthermore, the light reflecting portion 22 is not restricted in particular in the case in which the light reflecting portion 22 has a function for reflecting and diffusing a light, and can be made of, for instance, a white ink.

Furthermore, a rubber-like molding in which a diffusing substance made of titanium dioxide has been mixed can be bonded to the internal surface of the concave for luminous device 20, can be printed the internal surface of the concave for luminous device 20, or can be blasted to form it.

In the case of a metal foil such as an aluminum foil, the metal foil can be bonded by a transparent adhesive. Moreover, in the case of a metal thin film such as aluminum, gold, silver, and platinum, the metal thin film can be formed by a method such as a deposition, a sputtering, and an electroless plating. Furthermore, in the case of a white ink, for instance, an acrylic resin containing titanium dioxide can be used, and the acrylic resin can be coated by a method such as a dispenser and a printing.

Among the above means, the coating of a white ink is easy and preferable in consideration of operating characteristics.

In the case in which the light semi-permeable portion 11 and the light reflecting portion 22 are both made of a white ink, a film thickness of the light semi-permeable portion 11 is adjusted to be thin in such a manner that part of lights permeate in the light semi-permeable portion, and a film thickness of the light reflecting portion 22 is adjusted to be thick in such a manner that no lights permeate in the light reflecting portion.

A light diffusing agent such as resin beads and glass beads can be mixed to the white ink, thereby improving a light diffusion coefficient.

A shape of the concave for luminous device 20 is not restricted in particular and can be, for instance, a circular cone, a pyramid, a circular cylinder, a prism, or a hemisphere.

In the case in which the luminous device 14 is provided with a lens 13, the lens 13 is not restricted in particular in the case in which the lens 13 is transparent and has a surface with a specified curvature. For instance, the lens 13 can be made of a silicone resin or an epoxy resin.

Figure 16:
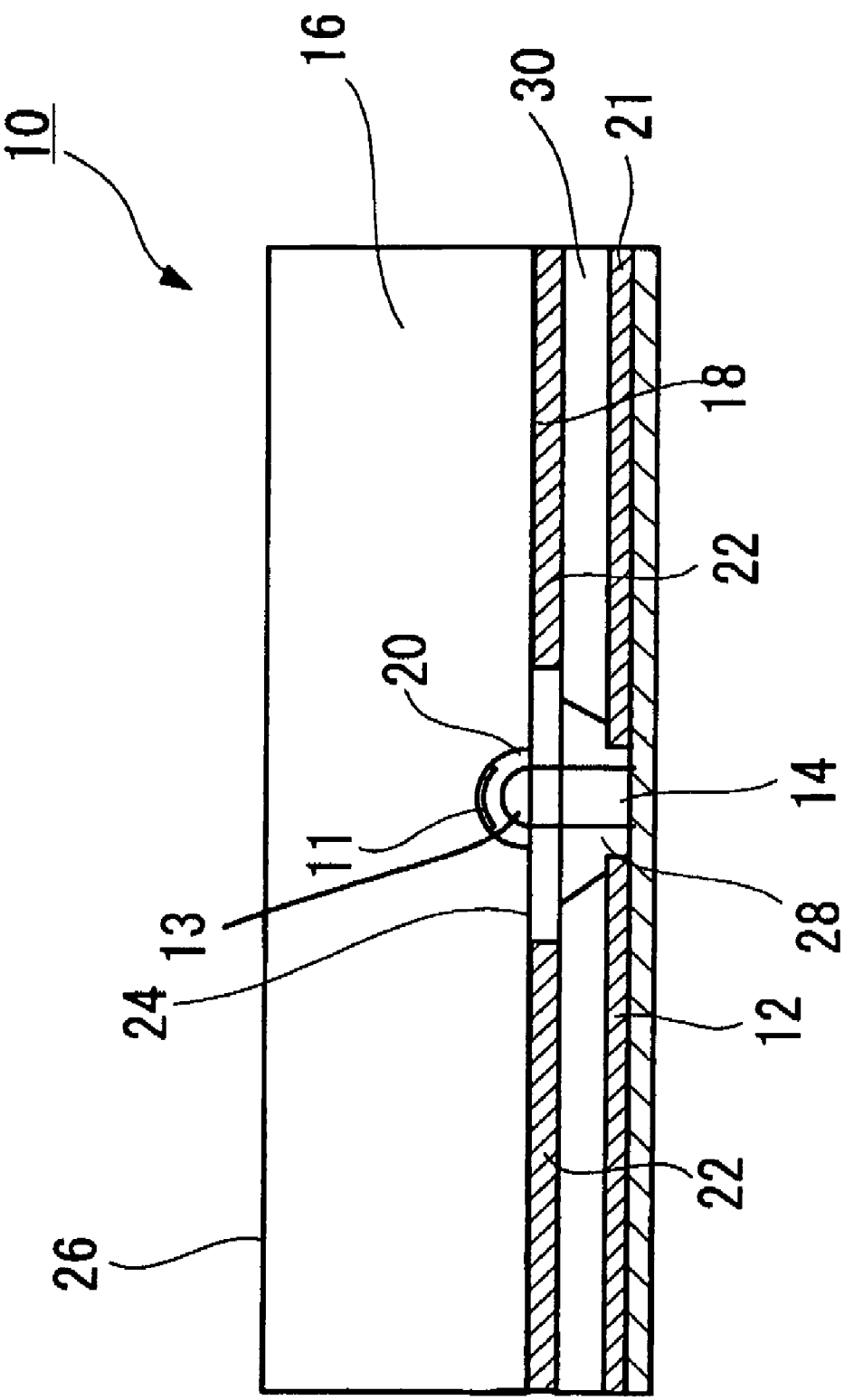
FIG. 16 is a schematic cross-sectional view showing a seventh embodiment of a planar light source device related to the present invention.

Moreover, in the seventh embodiment shown in FIG. 16, a concave for luminous device 28 can be formed on the luminous device mounting substrate 12 side, and a reflector 30 can be formed between the luminous device mounting substrate 12 and the light guide member 16 through an insulating layer 21.

In the present embodiment, a plurality of luminous devices 14 is disposed at a constant pitch in an array pattern on the upper face of the luminous device mounting substrate 12. However, the number of the luminous devices 14 (one luminous device is possible as a matter of course) and a disposition manner thereof are not restricted in particular, and can be properly modified. For instance, the luminous devices 14 can also be disposed in a concentric circle pattern or in a staggered pattern.

A planar light source device 10 configured as described above according to the present invention is used as an illuminant such as an advertising lamp, an illumination, and a back light for a liquid crystal display. For instance, in the case in which the planar light source device is used as a back light for a liquid crystal display, as shown in FIG. 1, a liquid crystal display apparatus can be configured by disposing a liquid crystal panel on the upper face of the light guide member 16 through a diffusing member and a prism sheet.

Figure 17:
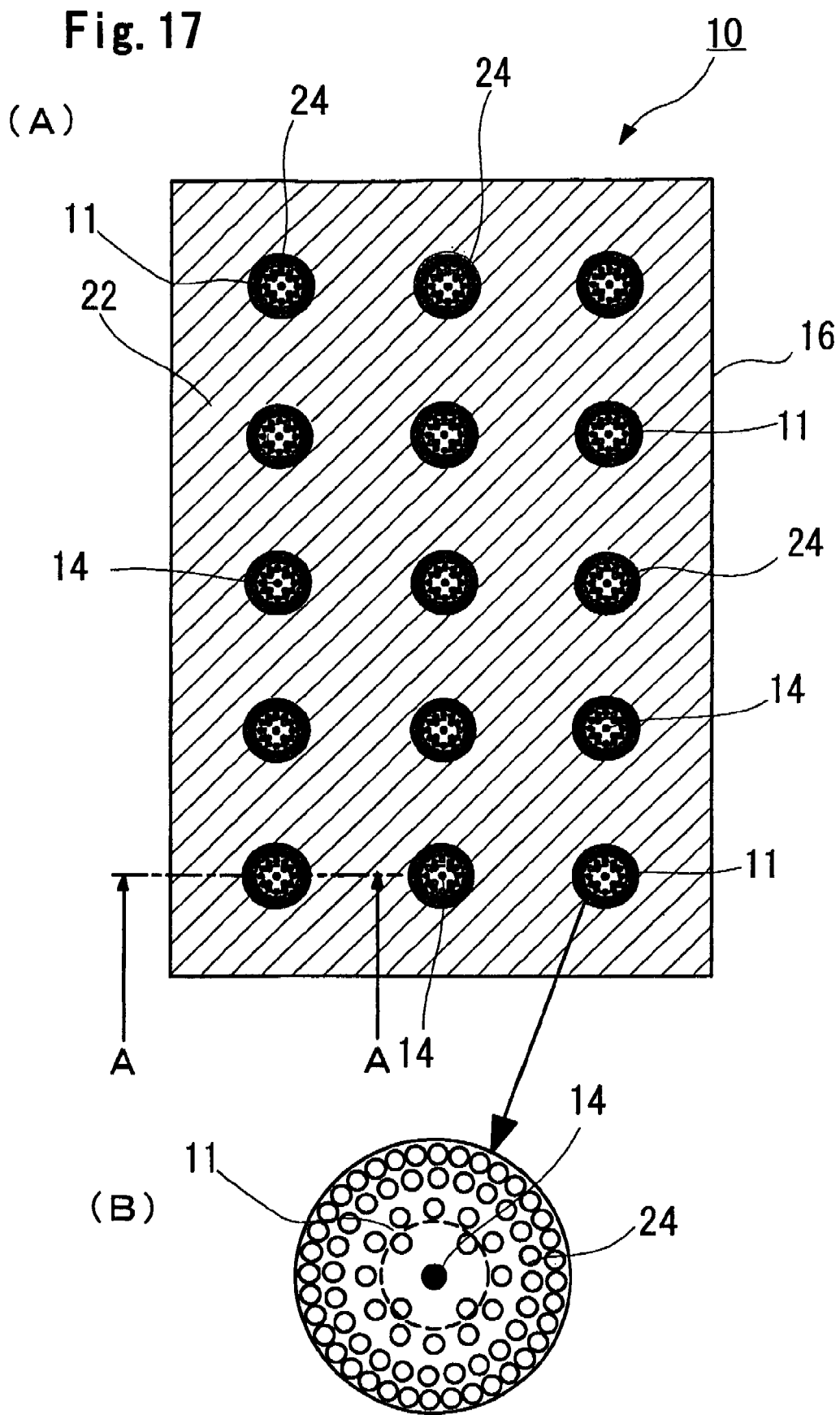
FIG. 17 is a top view showing a eighth embodiment of a planar light source device related to the present invention to which a light guide member related to another embodiment of the present invention is applied.

FIG. 17 is a top view showing an eighth embodiment of a planar light source device related to the present invention to which a light guide member related to another embodiment of the present invention is applied.

Since the configuration of a planar light source device 10 related to the present embodiment is basically equivalent to that of a planar light source device 10 shown in FIGS. 2 and 3, elements equivalent to those illustrated previously are numerically numbered similarly and the detailed descriptions of the equivalent elements are omitted.

In the planar light source device 10 related to the present embodiment, as shown in FIG. 17, like the fourth embodiment, a light scattering dot pattern is formed in the area 24 near around the luminous device 14, in which the light reflecting portion 22 is not formed, on the bottom face 18 of the light guide member 16.

The light scattering dot pattern is formed in such a manner that a dot density of the light reflecting portion in a dot shape is lower at a section closer to the luminous device.

By forming a dot pattern as described above, there can be relaxed a gap of a strength of a diffusion light at the boundary between the area 24 near around the luminous device 14 and the light reflecting portion 22.

While the dot printing pattern is not restricted in particular, the dot printing pattern is a circular pattern of which the center is the position directly over the luminous device 14 and in which a strength of a diffusion upward from the light guide member 16 is minimum at the center of the dot pattern and is larger at a position closer to the periphery.

Such a light scattering dot can be formed by the dot printing of a scattering ink or an integral molding with the light guide member 16.

The scattering ink is not restricted in particular and there can be used, for instance, an ink containing resin beads or glass beads, or the above described white ink.

In the planar light source device 10 having such a configuration, a luminance around the section directly over the luminous device 14 is decreased, thereby obtaining a uniform luminance.

While the light scattering dot pattern is formed in the area 24 near around the luminous device 14 on the bottom face 18 of the light guide member 16 in the present embodiment, minute uneven shapes can also be formed on the bottom face 18 of the light guide member 16 in order to control a strength of a diffusion light in place of the dot shape.

EMBODIMENTS

Embodiment 1

The unit luminous devices in which LED chips of red, green, and blue of a 1 W class are combined as the luminous device 14 were disposed in an array pattern, as shown in FIG. 2, on the luminous device mounting substrate 12 of transverse 115 mm×longitudinal 135 mm.

A transparent plate made of an acrylic resin of transverse 115 mm×longitudinal 135 mm and a thickness of 3 mm was prepared as the light guide member 16.

A concave for luminous device 20 in a semi-spherical shape with a radius of 2.5 mm was formed on the bottom face 18 of the light guide member 16 at the position directly over the center of each luminous device 14.

A white paint made of an acrylic resin containing titanium dioxide of 50% (only a solid matter) was coated on the bottom face 18 of the light guide member 16 by a spray coating in such a manner that a film thickness is 100 μm, thereby forming the light reflecting portion 22.

Figure 18:
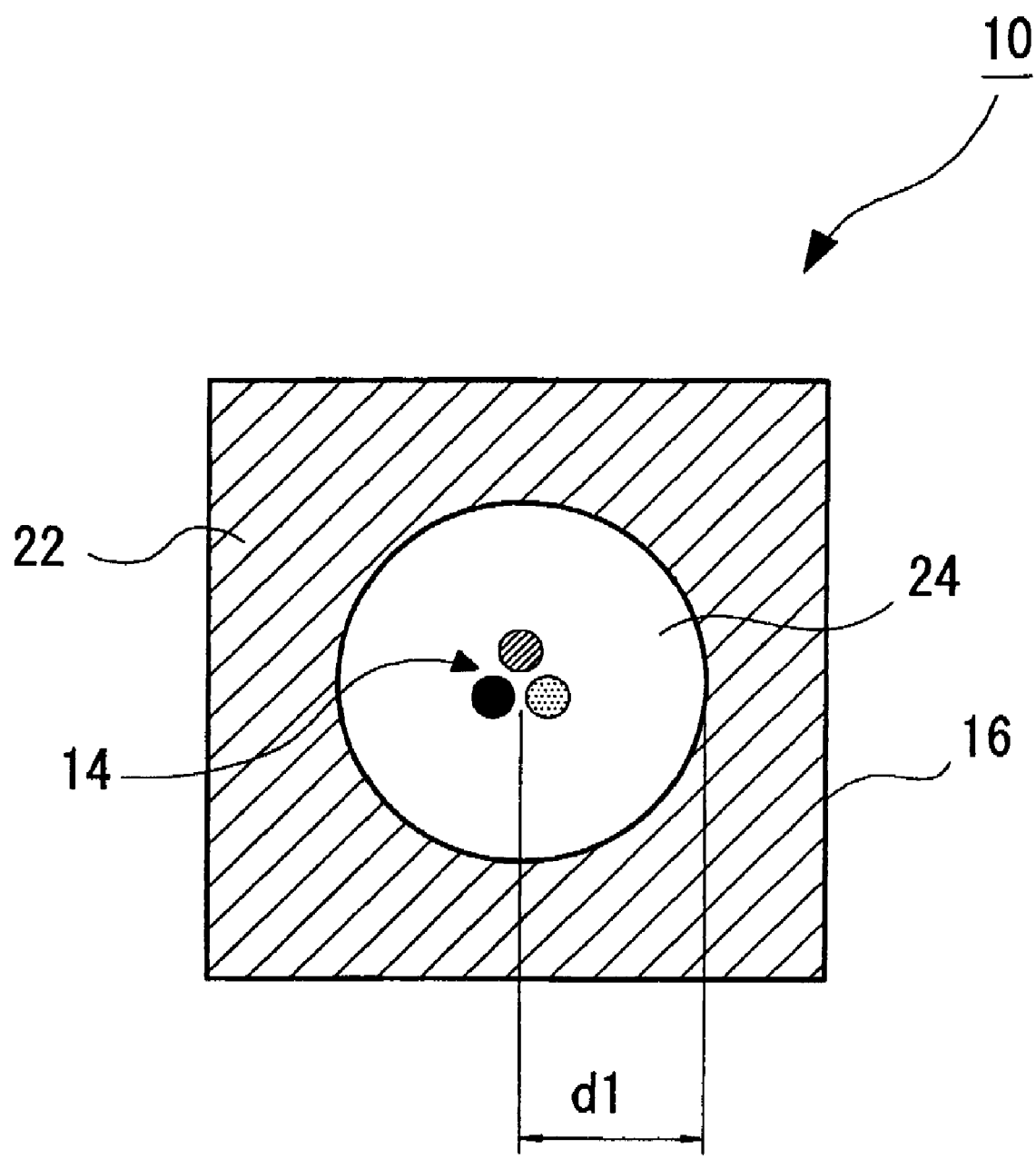
FIG. 18 is a top view showing a planar light source device related to the present invention to which a light guide member related to Embodiment 1 of the present invention is applied.

In this case, the light reflecting portion 22 was formed in an area other than the area 24 near around the luminous device 14. The area 24 near around the luminous device was formed in such a manner that a distance d1 from the center of the luminous device 14 to a peripheral edge of the area 24 near around the luminous device is 40 mm (see FIG. 18).

A distance D between the adjacent luminous devices 14 was 180 mm.

The transparent plate made of an acrylic resin was then laminated and fixed in such a manner that the concave for luminous device 20 faces to the luminous device 14, thereby obtaining a planar light source device 10 related to the present invention (see FIG. 3).

Subsequently, currents of 280 mA (red), 360 mA (green), and 120 mA (blue) were applied to a red LED, a green LED, and a blue LED, respectively.

By this, a relative luminance was then measured at a distance of 0.5 mm from the position O on the upper face of the diffusing plate at the 0.5 cm pitch in a horizontal direction by using Spectroradiometer CS-1000A (manufactured by Konica Minolta, Inc.). The relative luminance was measured while Diffusion plate PC9391-50HLW (manufactured by TEIJIN LIMITED.) was disposed at 25 mm over the resin light guide member related to the present invention.

Figure 23:
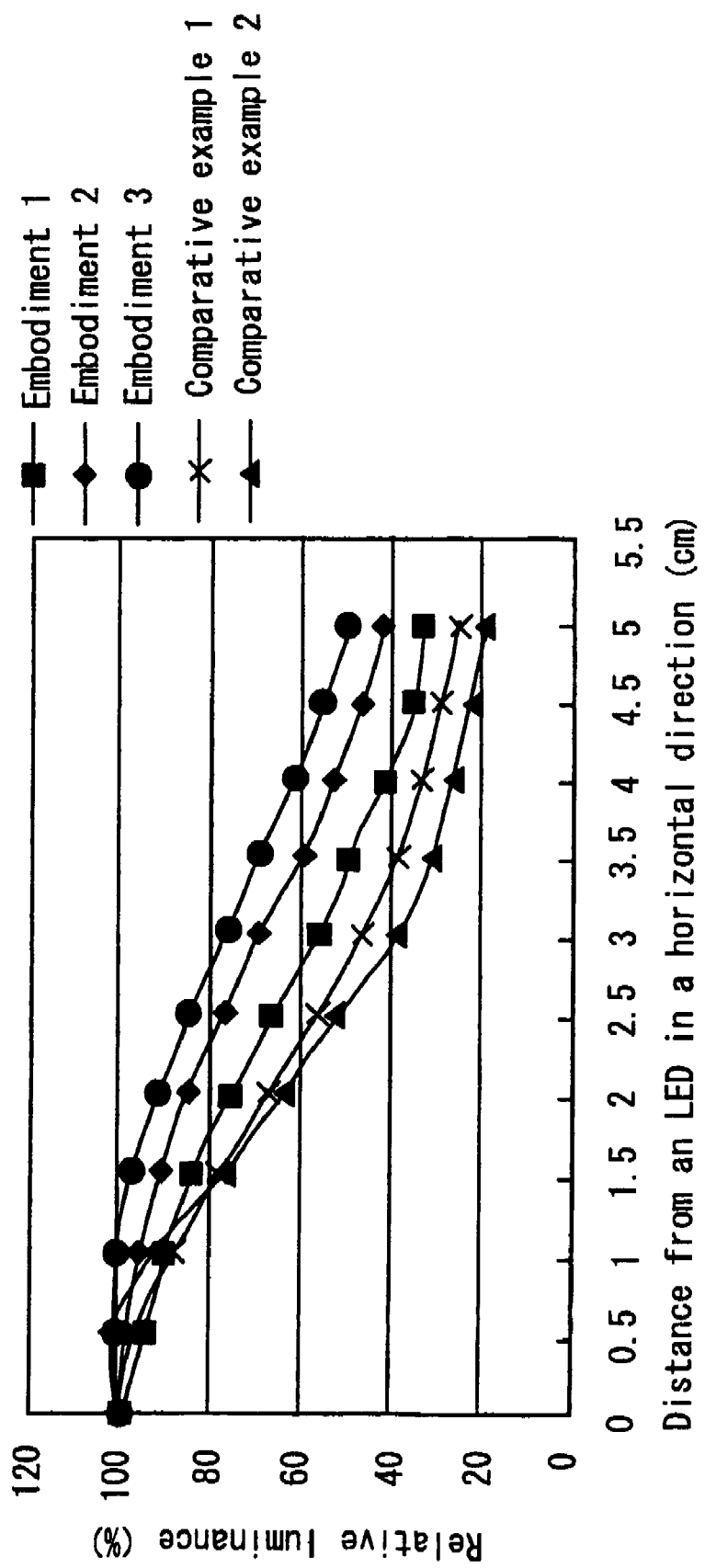
FIG. 23 is a graph showing a distance from a luminous device 14 in a horizontal direction and a relative luminance related to embodiments and Comparative examples of the present invention.
Figure 24:
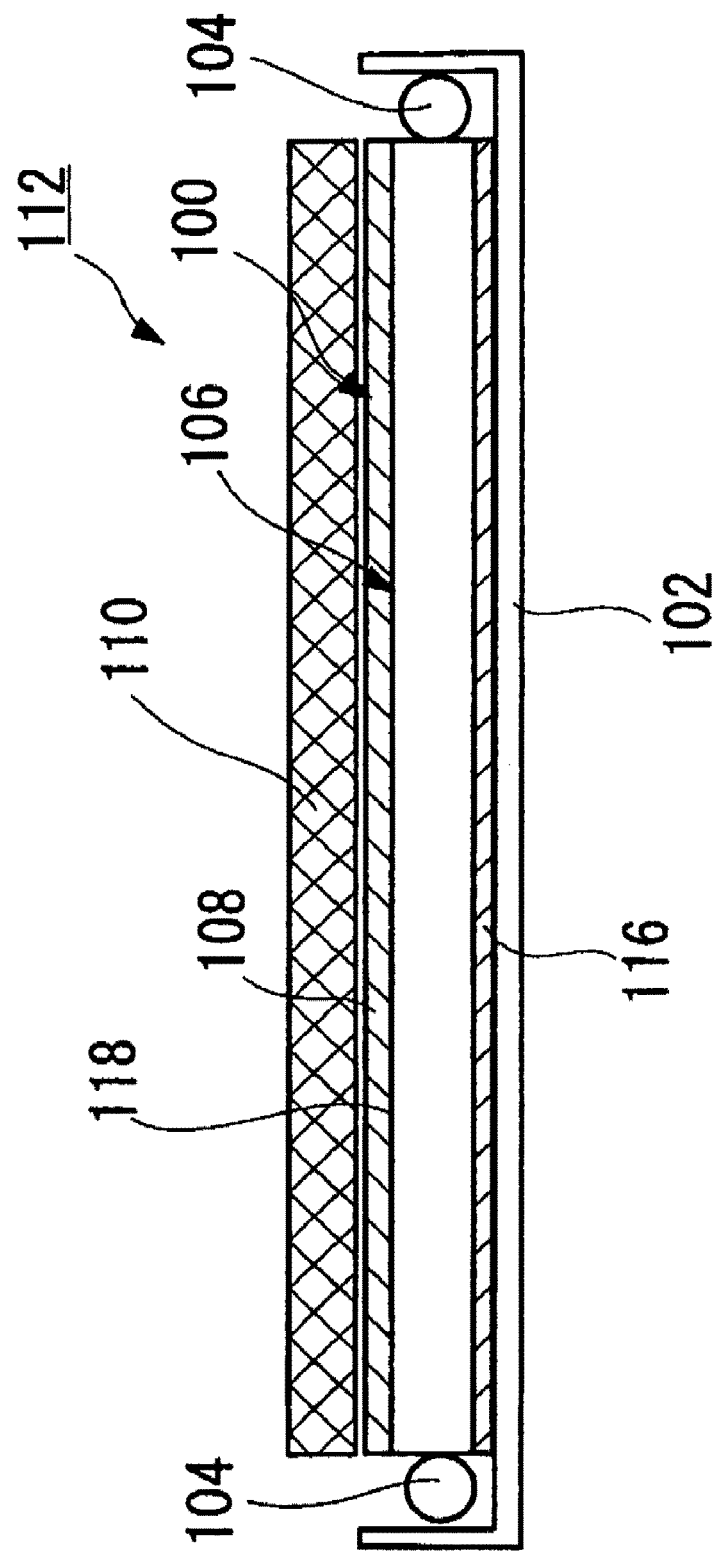
FIG. 24 is a schematic cross-sectional view showing a conventional back light illuminant of the edge light type.

The measured results are shown in Table 1 and the graph of FIG. 23.

Embodiment 2

Figure 19:
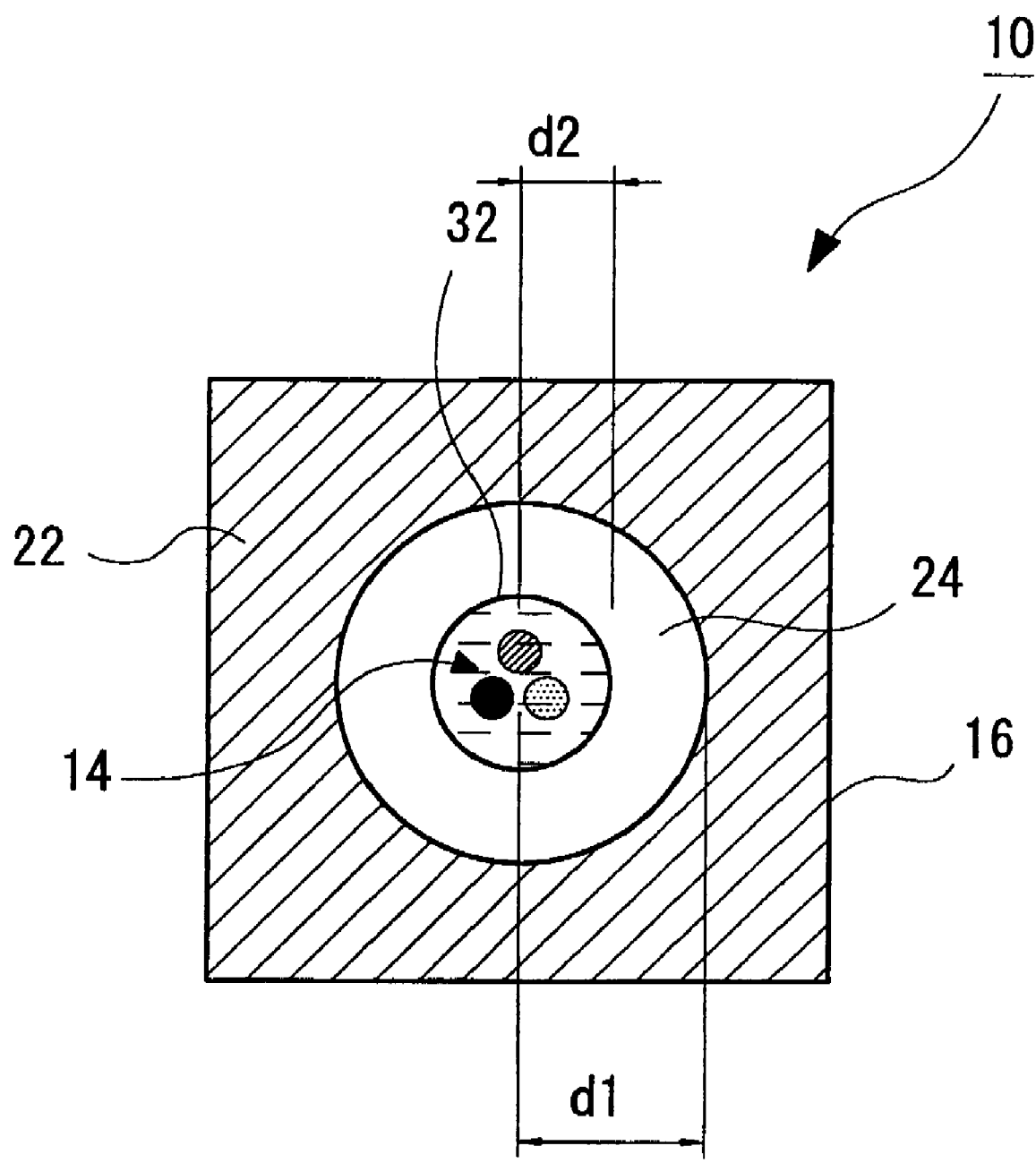
FIG. 19 is a top view showing a planar light source device related to the present invention to which a light guide member related to Embodiment 2 of the present invention is applied.

A planar light source device 10 related to the present invention as shown in FIG. 19 was obtained similarly to Embodiment 1 except for the following points.

More specifically, as shown in FIGS. 8 and 9, a light semi-permeable portion 32 in a circular shape is further formed at the position on the upper face of the light guide member 16 corresponding to the luminous device 14, that is, at the position directly over the luminous device 14.

A white paint made of an acrylic resin containing titanium dioxide of 50% (only a solid matter) was coated on the upper face area of the light guide member, in which a distance d2 from the luminous device 14 to a peripheral edge of the light semi-permeable portion 32 is 5 mm, by a spray coating in such a manner that a film thickness is 20 μm, thereby forming the light semi-permeable portion 32.

By this, a relative luminance was then measured at a distance of 0.5 mm from the position O on the upper face of the diffusing plate directly over the luminous device 14 at the 0.5 cm pitch in a horizontal direction similarly to Embodiment 1.

The measured results are shown in Table 1 and the graph of FIG. 23.

Embodiment 3

Figure 20:
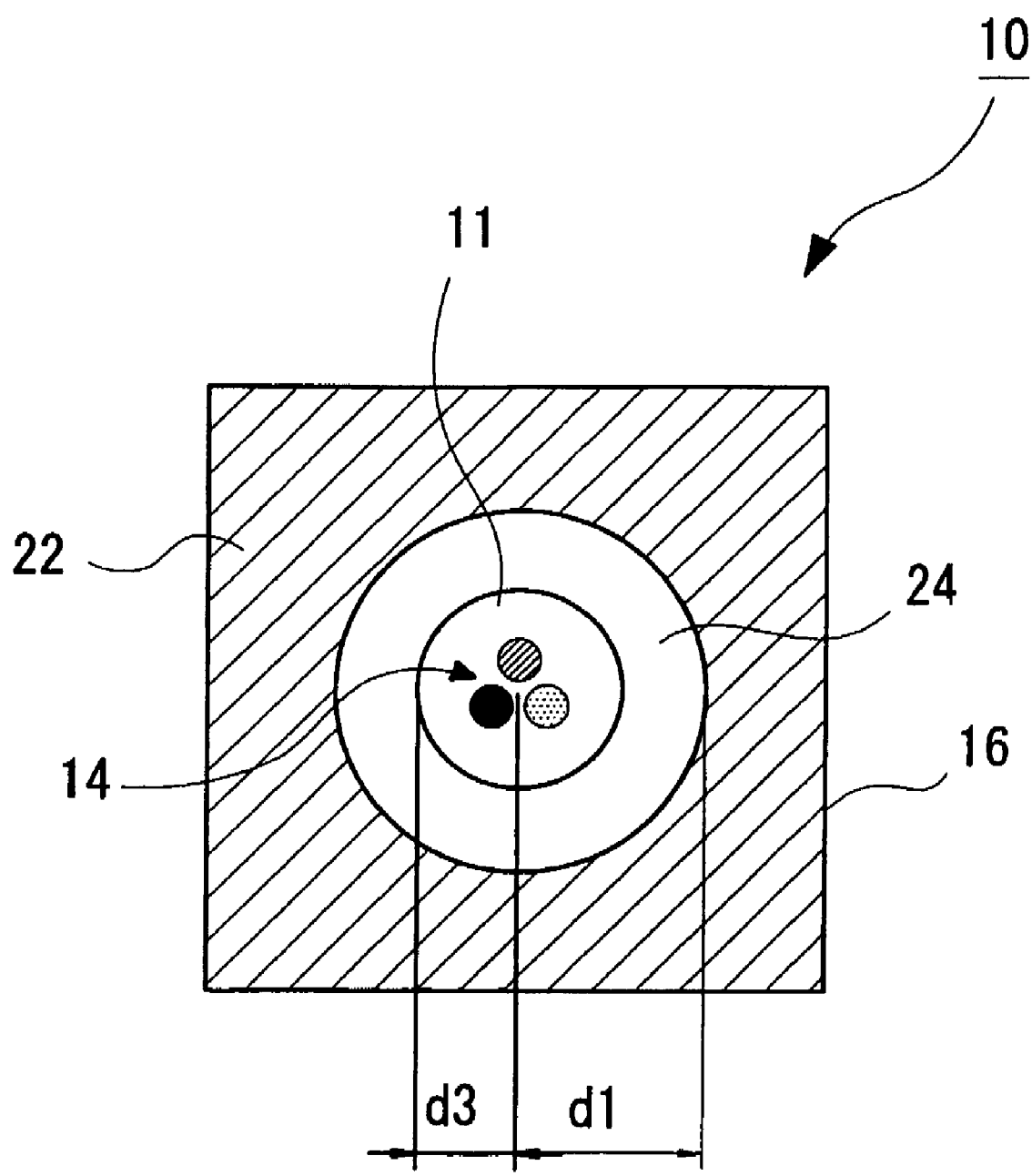
FIG. 20 is a top view showing a planar light source device related to the present invention to which a light guide member related to Embodiment 3 of the present invention is applied.

A planar light source device 10 related to the present invention as shown in FIG. 20 was obtained similarly to Embodiment 1 except for the following points.

More specifically, a light semi-permeable portion 11 is formed on the surface on the concave of the concave for luminous device 20.

A white paint made of an acrylic resin containing titanium dioxide of 50% was coated by a spray coating in such a manner that a film thickness is 20 μm, thereby forming the light semi-permeable portion 11.

A range in which the light semi-permeable portion 11 is formed, that is, a projection distance d3 from the center of the luminous device 14 to a peripheral edge of the light semi-permeable portion 11 is approximately 1.8 mm in such a manner that the LED chips of red, green, and blue are almost covered as shown in FIG. 20.

A white paint made of an acrylic resin containing titanium dioxide of 50% was coated on the almost entire face of the bottom face 18 of the light guide member 16 by a spray coating in such a manner that a film thickness is 200 μm, thereby forming the light reflecting portion 22.

In this case, the light reflecting portion 22 was formed in an area other than the area 24 near around the luminous device 14. The area 24 near around the luminous device was formed in such a manner that a distance d1 from the center of the luminous device 14 to a peripheral edge of the area 24 near around the luminous device is 40 mm (see FIG. 20).

The transparent plate made of an acrylic resin was then laminated and fixed in such a manner that the concave for luminous device 20 faces to the luminous device 14, thereby obtaining a planar light source device 10 related to the present invention (see FIG. 13).

Subsequently, currents of 280 mA (red), 360 mA (green), and 120 mA (blue) were applied to a red LED, a green LED, and a blue LED, respectively.

By this, a relative luminance was then measured at a distance of 0.5 mm from the position O on the upper face of the diffusing plate directly over the luminous device 14 at the 0.5 cm pitch in a horizontal direction.

The measured results are shown in Table 1 and the graph of FIG. 23.

Comparative Example 1

Figure 21:
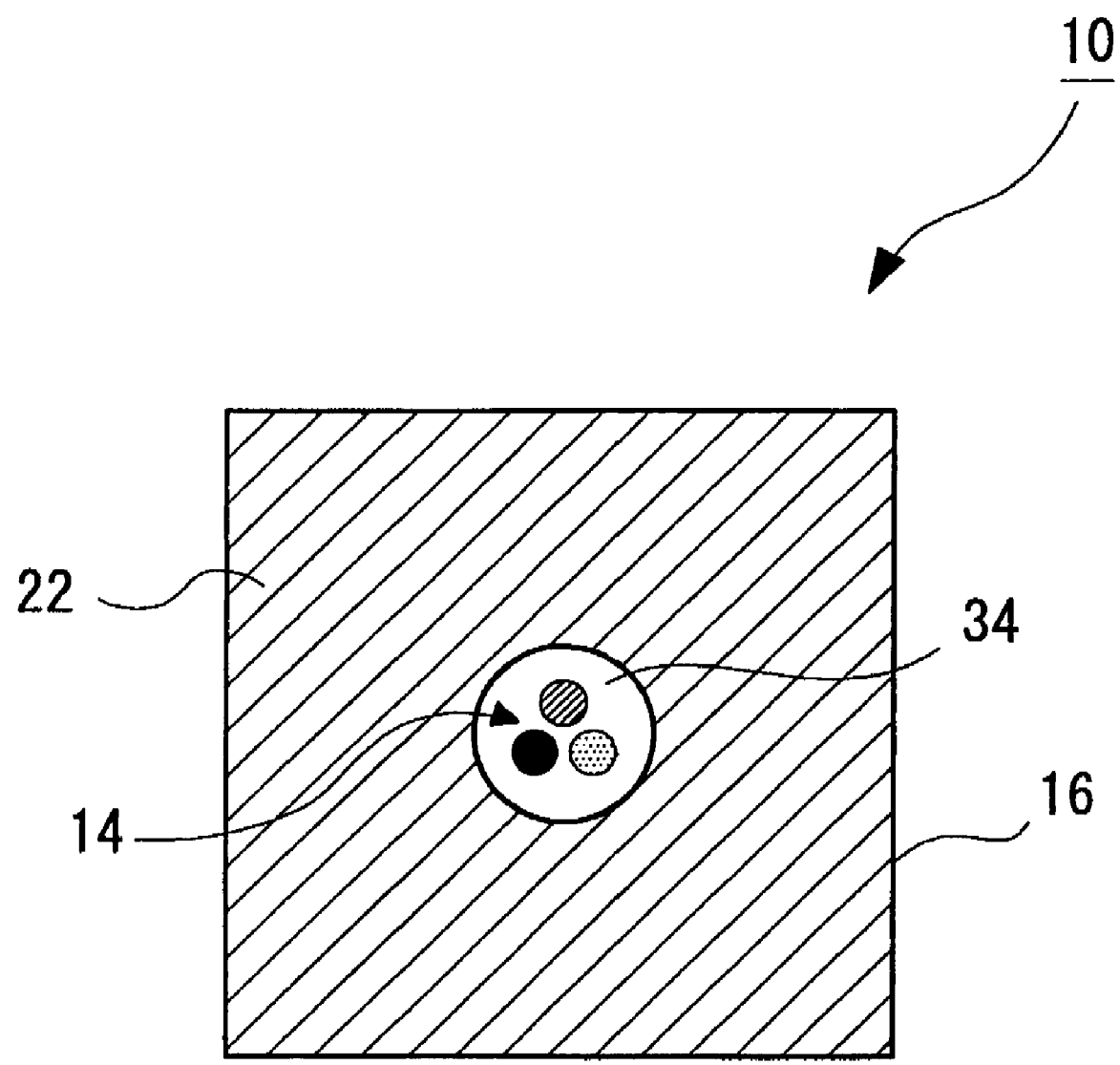
FIG. 21 is a top view showing a planar light source device related to the present invention to which a light guide member related to Comparative example 1 of the present invention is applied.

A planar light source device 10 as shown in FIG. 21 was obtained similarly to Embodiment 1 except for the following points.

More specifically, as shown in FIG. 21, a white paint made of an acrylic resin containing titanium dioxide of 50% (only a solid matter) was coated on the entire face of the bottom face 18 of the light guide member 16 except for the concave for luminous device 20 by a spray coating in such a manner that a film thickness become 100 μm, thereby forming the light reflecting portion 22. In this case, like Embodiment 1, the area 24 in a circular shape near around the luminous device in which the light reflecting portion 22 is not formed was not formed in substance, and there was formed only a small missing portion 34 in a circular shape, which corresponds to the concave for luminous device 20, with a diameter of 5 mm corresponding to a size of the luminous device 14.

By this, a relative luminance was then measured at a distance of 0.5 mm from the position O on the upper face of the diffusing plate directly over the luminous device 14 at the 0.5 cm pitch in a horizontal direction.

The measured results are shown in Table 1 and the graph of FIG. 23.

Comparative Example 2

Figure 22:
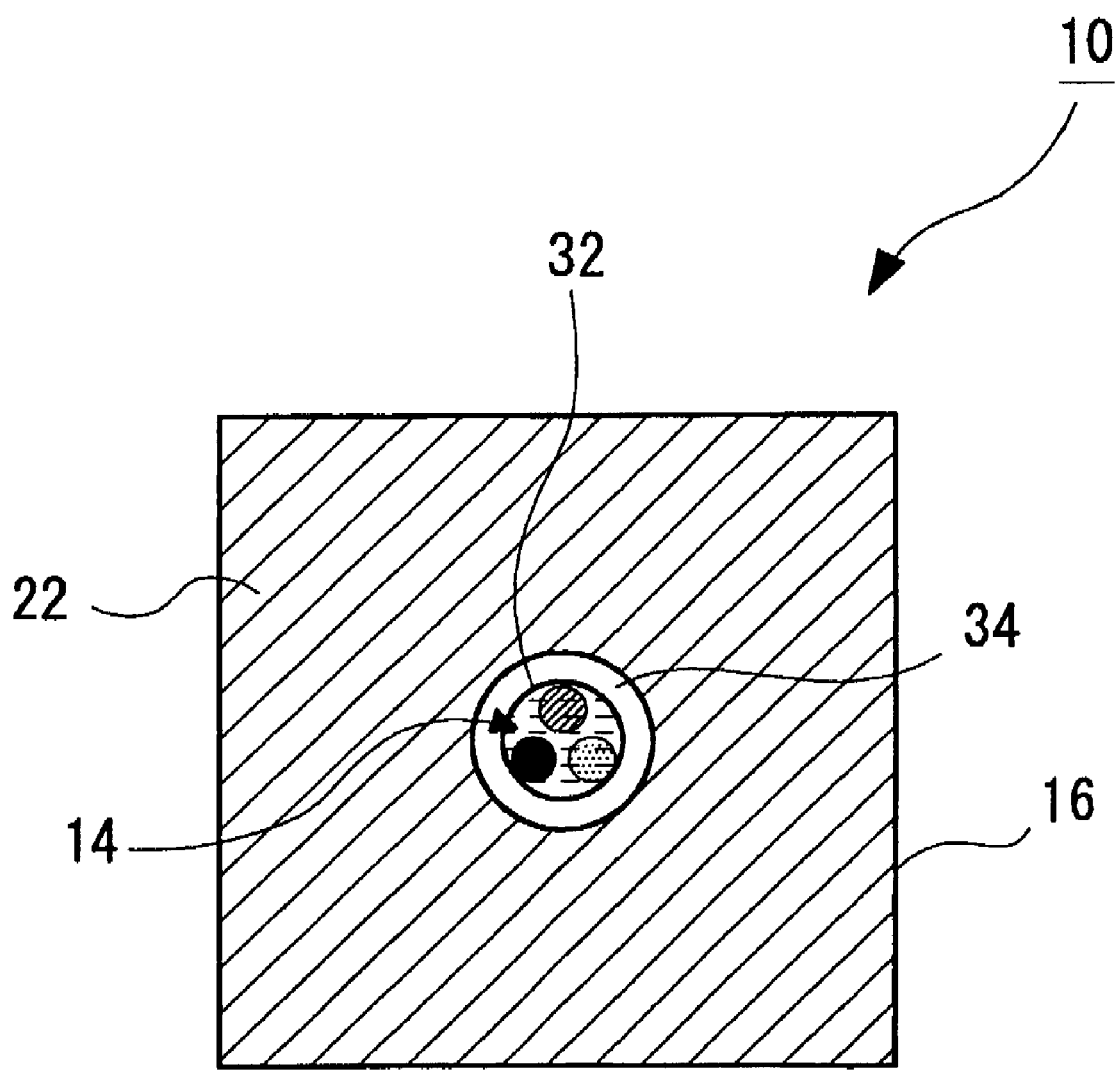
FIG. 22 is a top view showing a planar light source device related to the present invention to which a light guide member related to Comparative example 2 of the present invention is applied.

A planar light source device 10 as shown in FIG. 22 was obtained similarly to Embodiment 1 except for the following points.

More specifically, as shown in FIG. 22, a white paint made of an acrylic resin containing titanium dioxide of 50% (only a solid matter) was coated on the entire face of the bottom face 18 of the light guide member 16 except for the concave for luminous device 20 by a spray coating in such a manner that a film thickness become 100 μm, thereby forming the light reflecting portion 22. In this case, like Embodiment 1, the area 24 in a circular shape near around the luminous device in which the light reflecting portion 22 is not formed was not formed in substance, and there was formed only a small missing portion 34 in a circular shape, which corresponds to the concave for luminous device 20, with a diameter of 5 mm corresponding to a size of the luminous device 14.

A white paint made of an acrylic resin containing titanium dioxide of 50% (only a solid matter) was coated on the upper face area of the light guide member with a distance d2 from the luminous device 14 to a peripheral edge of the light semi-permeable portion 32 by a spray coating in such a manner that a film thickness is 20 μm, thereby forming the light semi-permeable portion 32. In this case, the light semi-permeable portion 32 was formed in such a manner that a size of the light semi-permeable portion 32 is a diameter of 4 mm, which is smaller than the above missing portion 34 (see FIG. 22).

By this, a relative luminance was then measured at a distance of 0.5 mm from the position O on the upper face of the diffusing plate directly over the luminous device 14 at the 0.5 cm pitch in a horizontal direction.

The measured results are shown in Table 1 and the graph of FIG. 23.

TABLE 1

| Distance (cm) | Embodiment 1 | Embodiment 2 | Embodiment 3 | Comparative example 1 | Comparative example 2 |
|---|---|---|---|---|---|
| 0 | 100 | 100 | 100 | 100 | 100 |
| 0.5 | 95.1 | 98 | 100 | 96.6 | 101.6 |
| 1 | 90.3 | 95.3 | 100 | 87.9 | 93 |
| 1.5 | 84.2 | 91 | 96.3 | 77.9 | 77.2 |
| 2 | 75.8 | 85.4 | 90.8 | 67.5 | 64.6 |
| 2.5 | 66 | 77.3 | 85.1 | 57 | 52.5 |
| 3 | 57.4 | 70 | 77.5 | 48 | 40.4 |
| 3.5 | 49.4 | 61 | 70 | 40 | 32.8 |
| 4 | 42 | 54.6 | 60.7 | 35 | 28 |
| 4.5 | 37.8 | 48.7 | 54.8 | 31 | 24.2 |
| 5 | 33.1 | 44 | 48 | 27 | 21.6 |

By Table 1 and FIG. 23, it was found a relative luminance outside to the position directly over the luminous device 14 is increased for a planar light source device 10 related to the present invention (Embodiment) as compared with the Comparative examples and a uniform luminance can be improved. In addition, a color mixture of RGB was also improved.

While the preferred embodiments of the present invention have been described above, the present invention is not restricted to the embodiments, and various changes and modifications can be thus made without departing from the scope of the present invention. For instance, while a light guide member and a planar light source device related to the present invention are useful for mounting a plurality of luminous devices with different luminance colors, it is also possible to mount a white luminous device to which a color mixture is not required.

The invention claimed is:

1. A light guide member, which is disposed over the upper face of a luminous device mounting substrate on which a luminous device is mounted and which is for diffusing and guiding upward a light emitted from the luminous device, comprising:
   a concave for the luminous device in the light guide member at a position corresponding to the luminous device,
   a light reflecting portion formed on the bottom face of the light guide member at a position not near around the luminous device, and
   a section in which a light reflecting portion is not formed on the bottom face of the light guide member at a position near around the luminous device,
   wherein the section in which a light reflecting portion is not formed on the bottom face of the light guide member extends beyond the concave formed in the light guide member in a direction away from the luminous device.

2. A light guide member as defined in claim 1, further comprising:
   a light semi-permeable portion on a part of a surface on the concave of the concave for the luminous device.

3. A light guide member as defined in claim 2, wherein the light semi-permeable portion on the surface on the concave is formed at the position over the luminous device.

4. A light guide member as defined in claim 1, wherein the area near around the luminous device is an area to a uniform distance from the luminous device.

5. A light guide member as defined in claim 1, further comprising a light reflecting portion in a dot shape in the area near around the luminous device in such a manner that a dot density of the light reflecting portion is lower at a section closer to the luminous device.

6. A light guide member as defined in claim 1, further comprising a light semi-permeable portion at a position on the upper face of the light guide member corresponding to the luminous device.

7. A light guide member as defined in claim 6, wherein the light semi-permeable portion is formed on the upper face of the light guide member at the position directly over the luminous device.

8. A light guide member as defined in claim 7, wherein the light semi-permeable portion is formed on the upper face of the light guide member near around the luminous device to a uniform distance from the luminous device.

9. A light guide member as defined in claim 1, wherein a plurality of the luminous devices mounted on the luminous device mounting substrate is disposed apart and the areas near around the luminous devices in which a light reflecting portion is not formed are disposed at a plurality of the positions of the bottom face of the light guide member corresponding to the luminous devices, and wherein individual ones of the luminous devices are disposed within a corresponding concave formed in the light guide member, and individual ones of the areas near around the luminous devices in which a light reflecting portion is not formed extend beyond the corresponding cavity formed in the light guide member in a direction away from the luminous device.

10. A light guide member as defined in claim 9, wherein D/4 is equivalent to or larger than d in the case in which a distance between adjacent luminous devices of a plurality of the luminous devices is D and a uniform distance from the luminous device to a peripheral edge of the area near around the luminous device in which a light reflecting portion is not formed is d.

11. A light guide member as defined in claim 1, wherein the luminous device mounted on the luminous device mounting substrate is configured by a unit luminous device in which luminous devices of plural kinds with different luminance colors are combined, and the area near around the luminous device in which a light reflecting portion is not formed is formed corresponding to the unit luminous device.

12. A light guide member as defined in claim 2, wherein the luminous device mounted on the luminous device mounting substrate is configured by a unit luminous device in which luminous devices of plural kinds with different luminance colors are combined, and the concave for the luminous device is formed corresponding to the unit luminous device.

13. A planar light source device comprising the light guide member as defined in claim 1, the luminous device mounting substrate and the luminous device.

14. A planar light source device as defined in claim 13, wherein the luminous device is a light emitting diode.

15. A display apparatus, comprising a display portion disposed over the upper face of the planar light source device as defined in claim 13.

16. A display apparatus as defined in claim 15, wherein the display portion is a liquid crystal panel.

17. A light guide member as defined in claim 1, wherein a distance from the luminous device to a peripheral edge of the section is about 40 mm.

18. A light guide member as defined in claim 1, wherein a distance from the luminous device to a peripheral edge of the light reflecting portion is about 40 mm.

19. A light guide member as defined in claim 10, wherein d is about 40 mm.

* * * * *